(12) United States Patent
Wang et al.

(10) Patent No.: US 12,183,683 B2
(45) Date of Patent: Dec. 31, 2024

(54) ELECTRONIC PACKAGE STRUCTURE

(71) Applicant: Advanced Semiconductor Engineering, Inc., Kaohsiung (TW)

(72) Inventors: Wei-Jen Wang, Kaohsiung (TW); Po-Jen Cheng, Kaohsiung (TW); Fu-Yuan Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 194 days.

(21) Appl. No.: 17/501,952

(22) Filed: Oct. 14, 2021

(65) Prior Publication Data

US 2023/0124933 A1    Apr. 20, 2023

(51) Int. Cl.
| | | |
|---|---|---|
| *H01L 23/538* | (2006.01) | |
| *H01L 21/48* | (2006.01) | |
| *H01L 25/065* | (2023.01) | |
| *H01L 25/18* | (2023.01) | |
| *H01L 23/00* | (2006.01) | |
| *H01L 23/31* | (2006.01) | |

(52) U.S. Cl.
CPC ...... *H01L 23/5386* (2013.01); *H01L 21/4853* (2013.01); *H01L 23/5385* (2013.01); *H01L 23/5389* (2013.01); *H01L 25/0657* (2013.01); *H01L 23/3185* (2013.01); *H01L 24/73* (2013.01); *H01L 24/92* (2013.01); *H01L 25/18* (2013.01); *H01L 2224/73204* (2013.01); *H01L 2224/92125* (2013.01); *H01L 2225/06517* (2013.01); *H01L 2225/0652* (2013.01); *H01L 2225/06548* (2013.01); *H01L 2225/06572* (2013.01)

(58) Field of Classification Search
CPC ............ H01L 23/5386; H01L 23/5385; H01L 23/5389; H01L 23/3185; H01L 25/0657; H01L 25/18; H01L 21/4853; H01L 24/73; H01L 24/92; H01L 2224/73204; H01L 2224/92125; H01L 2225/06517; H01L 2225/0652; H01L 2225/06548; H01L 2225/06572; H10B 80/00; H10K 39/10; H10K 59/90; H10K 65/00; H10N 19/00; H10N 39/00; H10N 59/00; H10N 69/00; H10N 79/00; H10N 89/00
See application file for complete search history.

(56) References Cited

U.S. PATENT DOCUMENTS

| | | | |
|---|---|---|---|
| 2015/0041987 A1* | 2/2015 | Yew ...................... | H01L 23/562 257/774 |
| 2017/0170130 A1* | 6/2017 | Kaneda ................. | H01L 25/105 |
| 2020/0075562 A1* | 3/2020 | Yu ....................... | H01L 25/0657 |

* cited by examiner

*Primary Examiner* — Timor Karimy
(74) *Attorney, Agent, or Firm* — FOLEY & LARDNER LLP

(57) ABSTRACT

An electronic package structure includes an electronic structure, a wiring structure, an electrical contact and a support layer. The wiring structure is located over the electronic structure. The electrical contact connects the wiring structure and the electronic structure. The support layer is disposed around the electrical contact and has a surface facing the electrical contact. The surface includes at least one inflection point in a cross-sectional view.

8 Claims, 23 Drawing Sheets

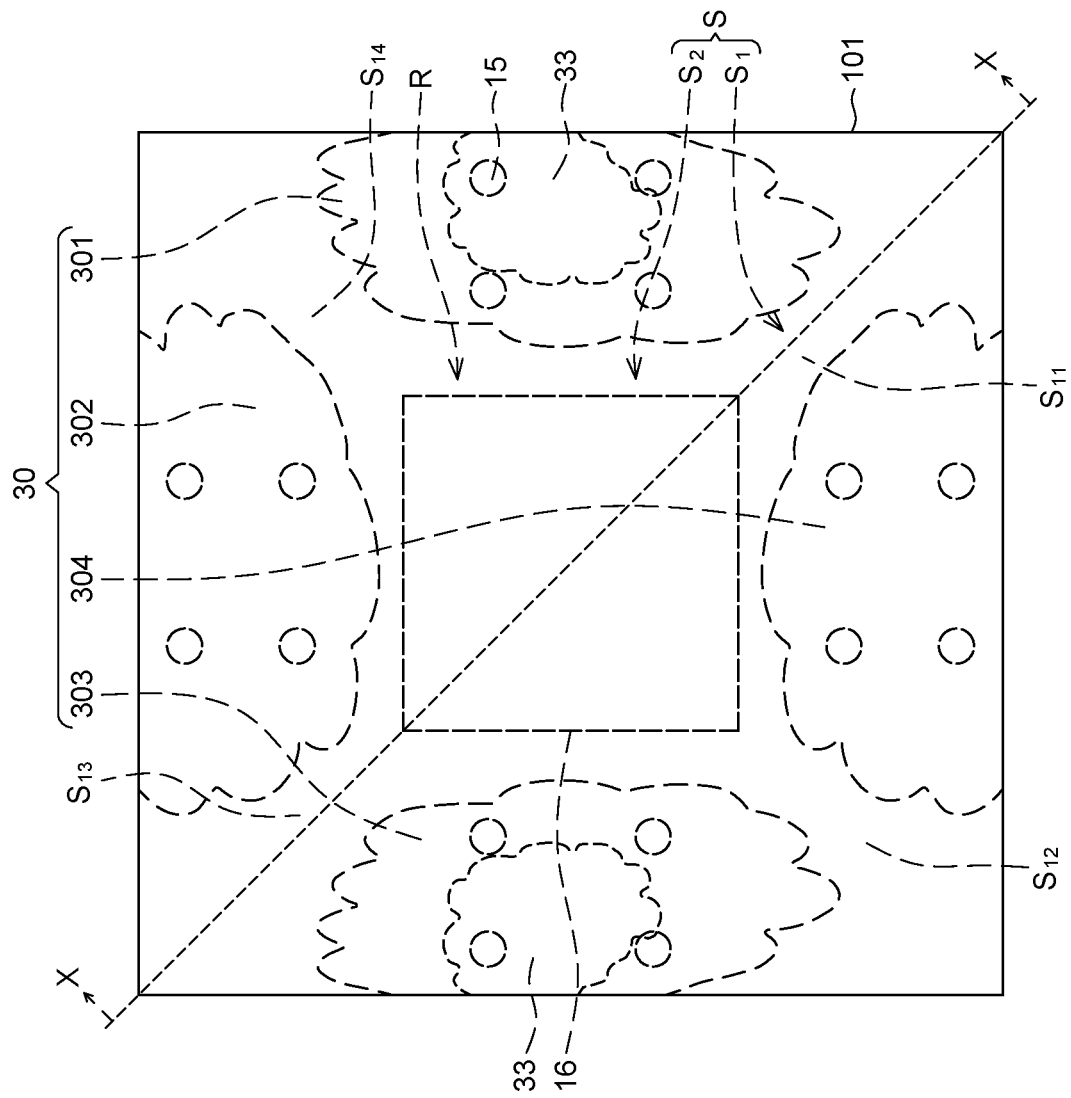

ELECTRONIC PACKAGE STRUCTURE

BACKGROUND

1. Field of the Disclosure

The present disclosure relates to an electronic package structure, and to an electronic package structure including a support layer around at least one electrical contact.

2. Description of the Related Art

As for a stacked product such as a wiring structure electrically connected to a package structure, small size solders may be used to electrically connect the wiring structure and the package structure, thereby preventing the solders from bridging. However, it is difficult for the underfill to flow between the wiring structure and the package structure to cover and protect the small size solders since the space between the wiring structure and the package structure is too small. In addition, the warpage may cause the small size solders to fail to joint with the package structure or the wiring structure, resulting in reduced yield of the stacked product.

SUMMARY

In some embodiments, an electronic package structure includes an electronic structure, a wiring structure, an electrical contact and a support layer. The wiring structure is located over the electronic structure. The electrical contact connects the wiring structure and the electronic structure. The support layer is disposed around the electrical contact and has a surface facing the electrical contact. The surface includes at least one inflection point in a cross-sectional view.

In some embodiments, an electronic package structure includes an electronic structure, a wiring structure, a space and at least two electrical contacts. The wiring structure is located over the electronic structure. The space is between the wiring structure and the electronic structure. The space includes a first region having a first height and a second region having a second height different form the first height. The at least two electrical contacts are located respectively in the first region and the second region. A width of each of the electrical contacts is greater than a height thereof.

In some embodiments, an electronic package structure includes an electronic structure, a wiring structure, an interlayer and a channel. The wiring structure is located over the electronic structure. A space is between the wiring structure and the electronic structure. The interlayer is located in the space. The channel is located in the space and divides the interlayer. The channel extends to outside of the electronic package structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 4G illustrates a top view of FIG. 4E.

DETAILED DESCRIPTION

Figure 1:
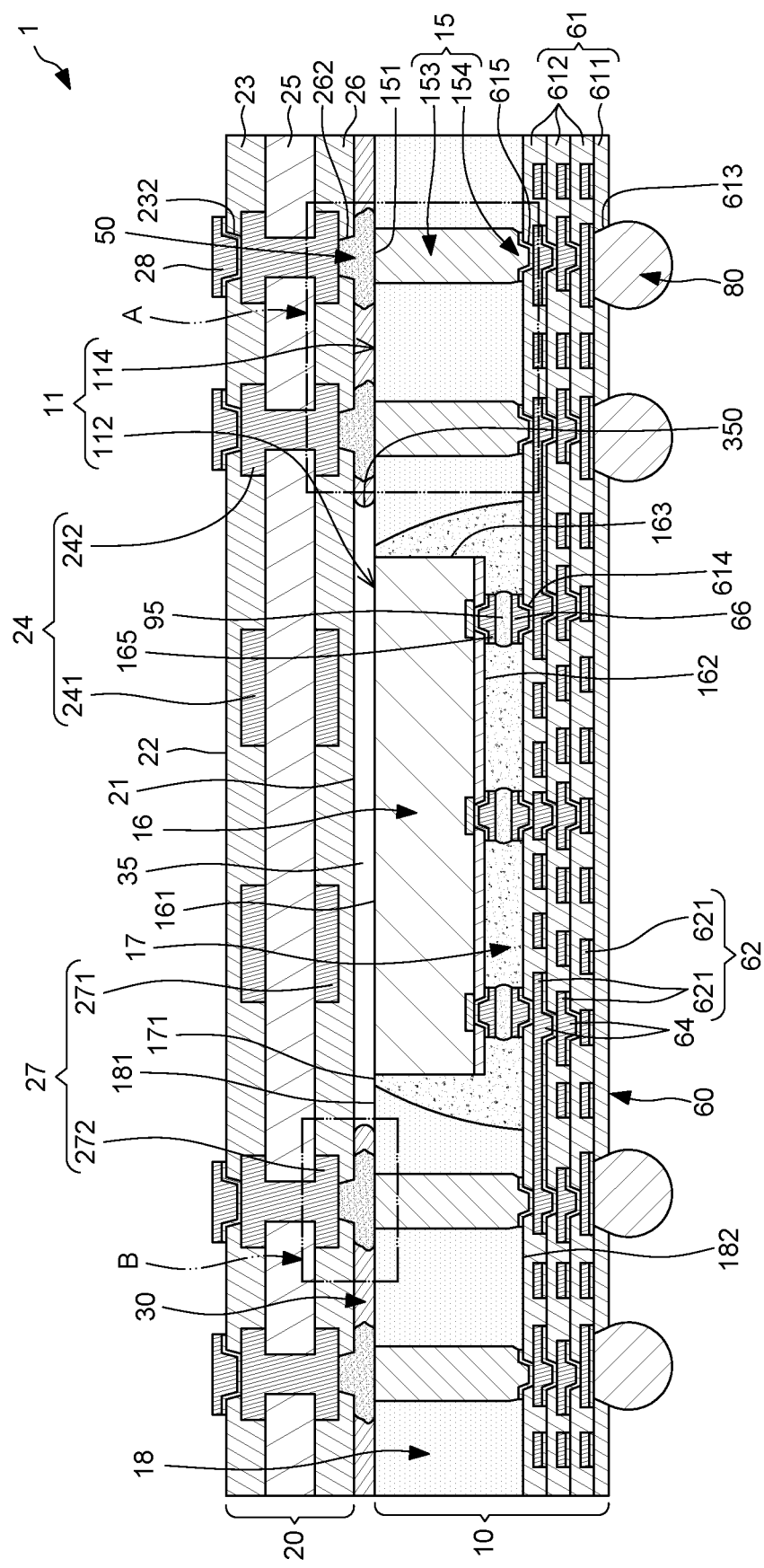
FIG. 1 illustrates a cross-sectional view of an electronic package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
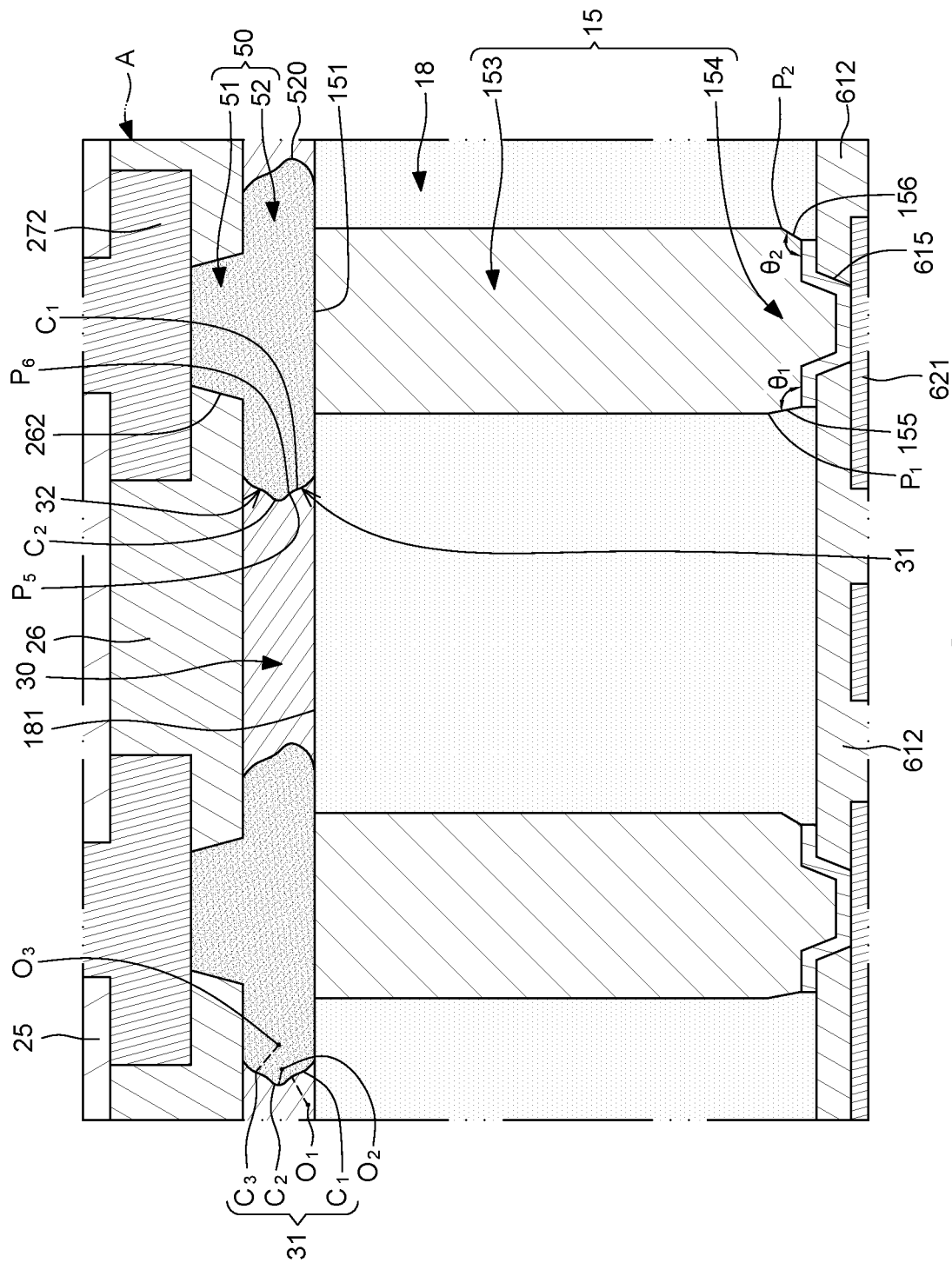
FIG. 2 illustrates an enlarged view of an area "A" of FIG. 1.
Figure 3:
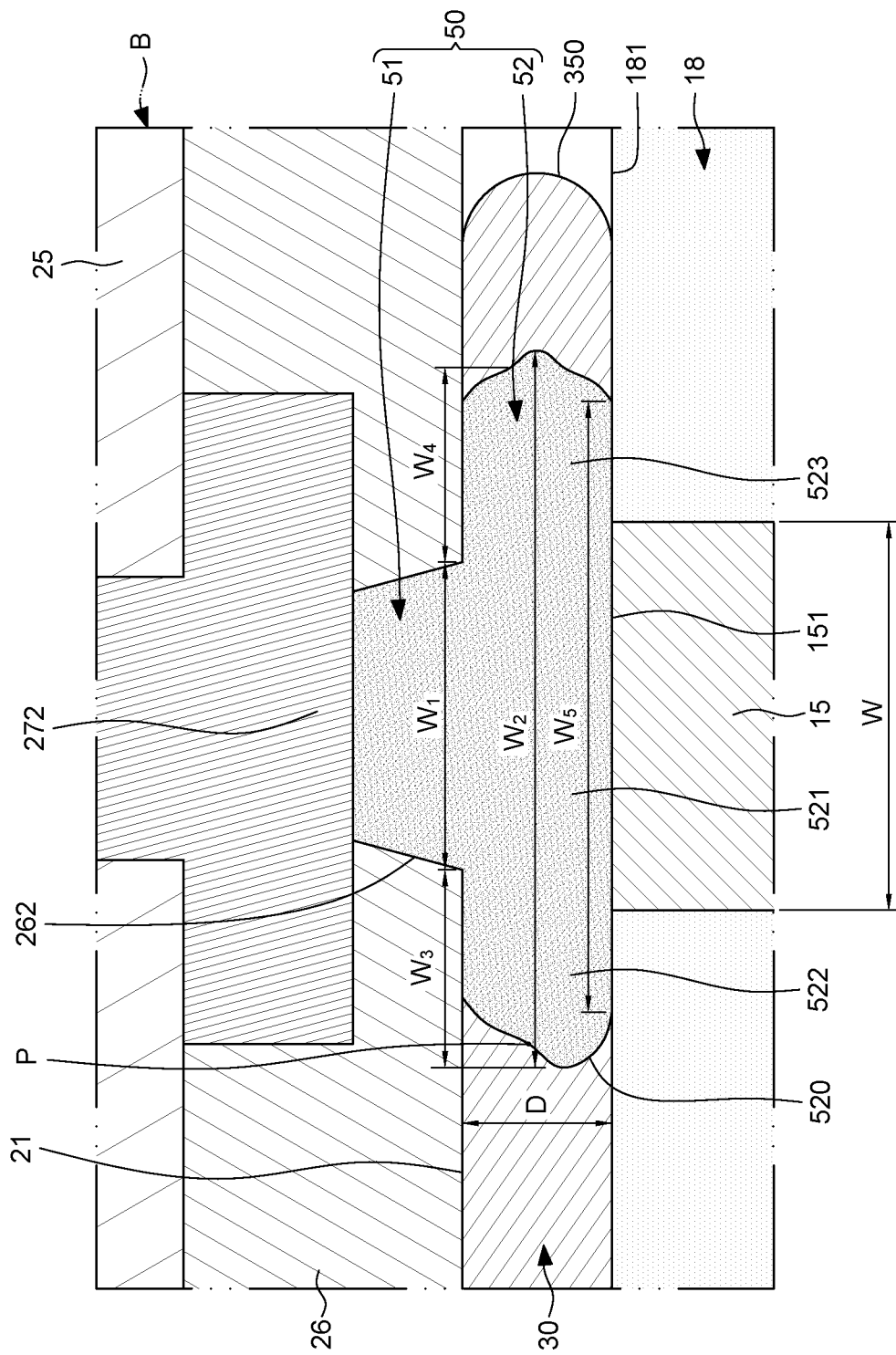
FIG. 3 illustrates an enlarged view of an area "B" of FIG. 1.

FIG. 1 illustrates a cross-sectional view of an electronic package structure 1 according to some embodiments of the present disclosure. FIG. 2 illustrates an enlarged view of an area "A" of FIG. 1. FIG. 3 illustrates an enlarged view of an area "B" of FIG. 1. The electronic package structure 1 includes an electronic structure 10, a wiring structure 20, a support layer 30 and at least one electrical contact 50. In some embodiments, the electronic package structure 1 may include a plurality of electrical contacts 50.

The electronic structure 10 may be, for example, a package structure. The electronic structure 10 may include a redistribution structure 60, at least one conductive pillar 15, at least one semiconductor element 16, an underfill 17, an encapsulant 18 and a plurality of electrical connectors 80. The electronic structure 10 has a top surface 11 facing the wiring structure 20. The top surface 11 may define a low-density region 112 and a high-density region 114 around the low-density region 112.

The redistribution structure 60 may include a dielectric structure 61, a redistribution layer 62, a plurality of inner vias 64 and a plurality of bonding pads 66. The dielectric structure 61 may include a plurality of dielectric layers (including, for example, one first dielectric layer 611 and three second dielectric layers 612). The second dielectric layers 612 may be disposed on a top surface of the first dielectric layer 611 and stacked on one another. The first dielectric layer 611 and the second dielectric layers 612 may be made of a cured photoimageable dielectric (PID) material such as epoxy or polyimide (PI) including photoinitiators. The redistribution layer 62 may be embedded in the dielectric structure 61 and may include a plurality of circuit layers 621. The inner vias 64 may electrically connect at least one circuit layer 621 or two adjacent circuit layers 621 of the redistribution layer 62. In some embodiments, the inner vias 64 may taper downward. That is, a width of each of the inner vias 64 may gradually decrease toward the first dielectric layer 611. In addition, the first dielectric layer 611 may define a plurality of openings 613 extending through the first dielectric layer 611 to expose portions of the bottommost circuit layer 621 of the redistribution layer 62. The topmost second dielectric layer 612 may cover the topmost circuit layer 621, and may define a plurality of openings (including, for example, openings 614 and openings 615) to expose portions of the topmost circuit layer 621.

The bonding pads 66 may be disposed in the openings 614 of the topmost second dielectric layer 612 and on the exposed portions of the topmost circuit layer 621.

The redistribution structure 60 may be also referred to as "a stacked structure" or "a high-density electronic structure" or "a high-density stacked structure." The redistribution layer 62 (including, for example, the three circuit layers 621) of the redistribution structure 60 may be also referred to as "a high-density redistribution layer."

In some embodiments, the electronic structure 10 may include a plurality of conductive pillars 15 spaced apart from each other. The conductive pillars 15 may be disposed in the openings 615 of the topmost second dielectric layer 612 and on the exposed portions of the topmost circuit layer 621. The conductive pillars 15 may correspond to the high-density region 114 of the top surface 11. A material of the conductive pillar 15 may be, for example, copper, silver (Ag), gold (Au) or other high conductivity metals or alloy. In the present embodiment, the material of the conductive pillar 15 is copper. Each of the conductive pillars 15 has a top surface 151 and may include an upper portion 153 and a lower portion 154 below the upper portion 153. In the present embodiment, as shown in FIG. 2, the lower portion 154 may include a first inclined sidewall 155 and a second inclined sidewall 156 opposite to the first inclined sidewall 155. An inclined angle $\theta_2$ of the second inclined sidewall 156 may be different from an inclined angle $\theta_1$ of the first inclined sidewall 155. A length of the second inclined sidewall 156 may different from a length of the first inclined sidewall 155.

Each of the conductive pillars 15 may further include a first inflection point $P_1$ and a second inflection point $P_2$ opposite to the first inflection point $P_1$. The first inflection point $P_1$ and the second inflection point $P_2$ may be between the upper portion 153 and the lower portion 154. In some embodiments, a distance between the first inflection point $P_1$ and the top surface 151 may be different from a distance between the second inflection point $P_2$ and the top surface 151.

Referring to FIG. 1, the semiconductor element 16 may be disposed adjacent to the redistribution structure 60 and electrically connected to the redistribution structure 60. The semiconductor element 16 may correspond to the low-density region 112 of the top surface 11. The semiconductor element 16 may be, for example, a bridge die. The semiconductor element 16 has an upper surface 161 (e.g., back side surface) and a lower surface 162 (e.g., active surface) opposite to the upper surface 161, and may include a plurality of conductive pads 165 disposed adjacent to the lower surface 162. A material of the conductive pad 165 may be, for example, aluminum (Al) tin (Sn), lead (Pb) or other low conductivity metals or alloy. In the present embodiment, the material of the conductive pad 165 is aluminum (Al). In some embodiments, the conductive pads 165 of the semiconductor element 16 may be bonded to the bonding pads 66 of the redistribution structure 60 through a bonding material 95 such as soldering material.

In some embodiments, the conductive pillars 15 may be disposed adjacent to the semiconductor element 16. A conductivity of each of the conductive pillars 15 may be greater than a conductivity of the conductive pad 165 (i.e., Al pad) of the semiconductor element 16. Further, the upper surface 161 of the semiconductor element 16 may be substantially coplanar with the top surface 151 of each of the conductive pillars 15.

The underfill 17 is disposed on the redistribution structure 60 to cover the bonding pads 66 of the redistribution structure 60, the bonding material 95 and a portion (e.g., the conductive pads 165, the lower surface 162 and a lateral surface 163) of the semiconductor element 16. In some embodiments, a top surface 171 of the underfill 17 may be substantially coplanar with the upper surface 161 of the semiconductor element 16 and the top surface 151 of each of the conductive pillars 15.

The encapsulant 18 is disposed on the redistribution structure 60 to encapsulate a portion of each of the conductive pillars 15 and a portion of the underfill 17. A material of the encapsulant 18 may be a molding compound with or without fillers. The encapsulant 18 has an upper surface 181 and a lower surface 182 opposite to the upper surface 181. In some embodiments, the upper surface 181 of the encapsulant 18 may be substantially coplanar with the upper surface 161 of the semiconductor element 16, the top surface 151 of each of the conductive pillars 15 and the top surface 171 of the underfill 17. In addition, the top surface 11 of the electronic structure 10 may include the upper surface 181 of the encapsulant 18, the upper surface 161 of the semiconductor element 16, the top surfaces 151 of the conductive pillars 15 and the top surface 171 of the underfill 17.

The electrical connectors 80 (e.g., solder balls or solder bumps) are disposed in the openings 613 of the first dielectric layer 611 and electrically connected to the exposed portions of the bottommost circuit layer 621 of the redistribution layer 62 for external connection.

The wiring structure 20 may be located over and electrically connected to the electronic structure 10 through the electrical contacts 50. The wiring structure 20 may be, for example, a substrate interposer. The wiring structure 20 may include at least one dielectric layer (including, for example, one upper dielectric layer 23 and one lower dielectric layer 26) and at least one circuit layer (including, for example, one upper circuit layer 24 and one lower circuit layer 27 formed of a metal, a metal alloy, or other conductive material) in contact with the dielectric layer (e.g., the upper dielectric layer 23 and the lower dielectric layer 26). In some embodiments, the wiring structure 20 may be similar to a core substrate that further includes a core portion 25, and may be in a wafer type, a panel type or a strip type. As shown in FIG. 1, the wiring structure 20 has a bottom surface 21 facing the electronic structure 10 and a top surface 22 opposite to the bottom surface 21. The wiring structure 20 includes a plurality of dielectric layers (for example, the upper dielectric layer 23 and the lower dielectric layer 26), a plurality of circuit layers (for example, the upper circuit layer 24 and the lower circuit layer 27) and a plurality of bonding pads 28. The upper circuit layer 24 is in contact with the upper dielectric layer 23, and may include at least one trace 241 and a plurality of connecting pads 242. The upper dielectric layer 23 may define a plurality of openings 232 extending through the upper dielectric layer 23 to expose portions of the connecting pads 242. The bonding pads 28 may be disposed in the openings 232 of the upper dielectric layer 23 and on the exposed portions of the connecting pads 242. The bonding pad 28 may include an under-bump metallurgy (UBM). Alternatively, the bonding pads 28 may be omitted. The lower circuit layer 27 is in contact with the lower dielectric layer 26, and may include at least one trace 271 and a plurality of connecting pads 272. The lower dielectric layer 26 may define a plurality of openings 262 extending through the lower dielectric layer 26 to expose portions of the connecting pads 272.

The wiring structure 20 may be also referred to as "a stacked structure" or "a low-density electronic structure" or "a low-density stacked structure". The circuit layer (including, for example, the upper circuit layer 24 and the lower circuit layer 27) of the wiring structure 20 may be also referred to as "a low-density circuit layer". In some embodiments, a density of a circuit line (including, for example, a trace or a pad) of the high-density redistribution layer (e.g., the redistribution layer 62 of the redistribution structure 60) is greater than a density of a circuit line of a low-density circuit layer (e.g., the circuit layer of the wiring structure 20). That is, the count of the circuit line (including, for example, a trace or a pad) in a unit area of the high-density redistribution layer is greater than the count of the circuit line in an equal unit area of the low-density circuit layer, such as about 1.2 times or greater, about 1.5 times or greater, or about 2 times or greater. Alternatively, or in combination, a line space/line width (L/S) of the high-density redistribution layer is less than an L/S of the low-density circuit layer, such as about 90% or less, about 50% or less, or about 20% or less.

The electrical contacts 50 may be, for example, reflowable connectors. The electrical contacts 50 may connect the wiring structure 20 and the electronic structure 10. The electrical contacts 50 may be disposed on the top surface 11 of the electronic structure 10 and squashed on the conductive pillars 15. Each of the electrical contacts 50 may be in contact with the upper portion 153 of each of the conductive pillars 15. In some embodiments, a width of the lower portion 154 of each of the conductive pillars 15 may gradually increase toward the corresponding electrical contact 50. In addition, as shown in FIG. 1, a number of the electrical contacts 50 in a unit area in the high-density region 114 may be greater than a number of the electrical contacts 50 in an equal unit area in the low-density region 112. In the present embodiment, the number of the electrical contacts 50 in the equal unit area in the low-density region 112 is zero. Further, a pitch between the electrical contacts 50 in the high-density region 114 may be less than a pitch between the electrical contacts 50 in the low-density region 112.

In some embodiments, as shown in FIG. 3, each of the electrical contact 50 may include a base portion 51 and an extending portion 52 below the base portion 51. The base portion 51 may extend in the opening 262 of the lower dielectric layer 26 of the wiring structure 20 and on the exposed portion of the connecting pads 272. The base portion 51 may taper upward. That is, a width of base portion 51 may gradually increase toward the extending portion 52 and the conductive pillar 15.

The extending portion 52 may be between the base portion 51 and the conductive pillar 15 and squashed on the top surface 151 of the conductive pillar 15. In some embodiments, the extending portion 52 may be squashed in a disk shape. The extending portion 52 may cover a portion of the bottom surface 21 of the wiring structure 20. That is, a width $W_2$ of the extending portion 52 may be greater than a width $W_1$ (e.g., a maximum width) of the base portion 51. In some embodiments, the width $W_2$ of the extending portion 52 may be greater than a thickness D thereof. Further, the width $W_2$ of the extending portion 52 may be greater than a width W of the conductive pillar 15. In some embodiments, the extending portion 52 may cover a portion of the upper surface 181 of the encapsulant 18. That is, there may be an interference or a boundary between the extending portion 52 of the electrical contact 50 and the encapsulant 18. A width $W_5$ of a region that the extending portion 52 of the electrical contact 50 contacts the encapsulant 18 may be greater than the width W of the conductive pillar 15.

In some embodiments, as shown in FIG. 3, a sidewall 520 of the extending portion 52 may curve outward. The sidewall 520 of the extending portion 52 may include at least one inflection point P. That is, the sidewall 520 of the extending portion 52 may include at least one convex portion and at least one concave portion. In a cross-sectional view, the extending portion 52 of the electrical contact 50 may include a main portion 521, a first extending portion 522 and a second extending portion 523. The main portion 521 is connected to the base portion 51. The first extending portion 522 extends outwardly from a side of the main portion 521 and is closer to a lateral surface (or an edge) 101 of the electronic structure 10 than the second extending portion 523 is. The second extending portion 523 extends opposite to the first extending portion 522. In addition, the first extending portion 522 and the second extending portion 523 may be outside a downward projection area of the connecting pad 272 electrically connecting the base portion 51 of the electrical contact 50. In some embodiments, the first extending portion 522 and the second extending portion 523 may be outside a downward projection area of the opening 262 of the lower dielectric layer 26. In some embodiments, a width $W_3$ of the first extending portion 522 may be different from a width $W_4$ of the second extending portion 523. Further, the width $W_3$ of the first extending portion 522 and the width $W_4$ of the second extending portion 523 may be greater than the thickness D of the extending portion 52. In some embodiments, a profile of a lateral surface of the first extending portion 522 and a profile of a lateral surface of the second extending portion 523 may be not substantially symmetric with each other. That is, the profile of the lateral surface of the first extending portion 522 may be different from the profile of the lateral surface of the second extending portion 523.

Referring to FIG. 1, the support layer 30 is disposed on the electronic structure 10 and around each of the electrical contacts 50. The support layer 30 may be also referred to as "an interlayer." The support layer 30 may be, for example, epoxy flux. In the present embodiment, the support layer 30 is disposed on the conductive pillars 15 of the electronic structure 10 before the wiring structure 20 is electrically connected to the electronic structure 10. In some embodiments, the support layer 30 may be further disposed on a portion of the upper surface 181 of the encapsulant 18. The support layer 30 may define at least one opening 35 extending through the support layer 30 to expose the upper surface 161 of the semiconductor element 16, the top surface 171 of the underfill 17 and the low-density region 112 of the top surface 11. That is, the support layer 30 may be disposed on the high-density region 114 of the top surface 11. In some embodiments, the opening 35 of the support layer 30 may further expose a portion of the upper surface 181 of the encapsulant 18. In addition, a sidewall 350 of the opening 35 may curve inward. In some embodiments, the support layer 30 may define a plurality of openings 35, and at least one of the openings 35 may be between the electrical contacts 50 in the high-density region 114. As shown in FIG. 1, the support layer 30 may not fill the space between the electronic structure 10 and the wiring structure 20. However, in other embodiments, the support layer 30 may fill the space between the electronic structure 10 and the wiring structure 20, thus, the openings 35 may not exist. In some embodiments, as shown in FIG. 2, the support layer 30 may define at least one recess portion 32 corresponding to the electrical contact 50. A lateral surface of the electrical contact 50 may be substantially conformal with a profile of the recess portion 32. In addition, the support layer 30 may have a surface 31 facing the electrical contact 50. The surface 31 may include at least two different curvatures (including, for example, one first curvature $C_1$ and one second curvature $C_2$) and at least one inflection point $P_5$ in a cross-sectional view. The inflection point $P_5$ may be between the two different curvatures (i.e., between the first curvature $C_1$ and the second curvature $C_2$). In addition, centers (e.g., centers $O_1$ and $O_2$) of the at least two different curvatures (e.g., the first curvature $C_1$ and the second curvature $C_2$) may be located at two sides of the surface 31, respectively. In some embodiments, the surface 31 may include at least three different curvatures (including, for example, the first curvature $C_1$, the second curvature $C_2$ and one third curvature $C_3$). Further, centers (e.g., centers $O_2$ and $O_3$) of the at least two different curvatures (e.g., the second curvature $C_2$ and the third curvature $C_3$) may be located at the same side of the surface 31. In some embodiments, the electrical contact 50 may include at least one inflection point $P_6$ overlapping the inflection point $P_5$ of the recess portion 32.

In the embodiment illustrated in FIG. 1 to FIG. 3, the support layer 30 is firstly disposed on the conductive pillars 15 of the electronic structure 10 before the wiring structure 20 is electrically connected to the electronic structure 10. After the wiring structure 20 is bonded to the conductive pillars 15 of the electronic structure 10 through the electrical contacts 50, the support layer 30 may be around each of the electrical contacts 50 to cover and protect the small size electrical contacts 50, lead to increased yield of the electronic package structures 1. In addition, the electrical contacts 50 squashed on the conductive pillars 15 may well joint with the electronic structure 10 (e.g., the conductive pillars 15) and the wiring structure 20 (e.g., the connecting pads 272). In some embodiments, a space between the wiring structure 20 and the electronic structure 10 may be less than or equal to 20 μm, thus, it is difficult to form the support layer 30 or an underfill through capillary attraction. To address such concern, the illustrated embodiment may conduct a thermocompression bonding technique to press the electrical contacts 50 to extend through the support layer 30 that is already disposed on the top surface 11 of the electronic structure 10. Thus, the electrical contacts 50 may be completely covered by the support layer 30.

Figure 4:
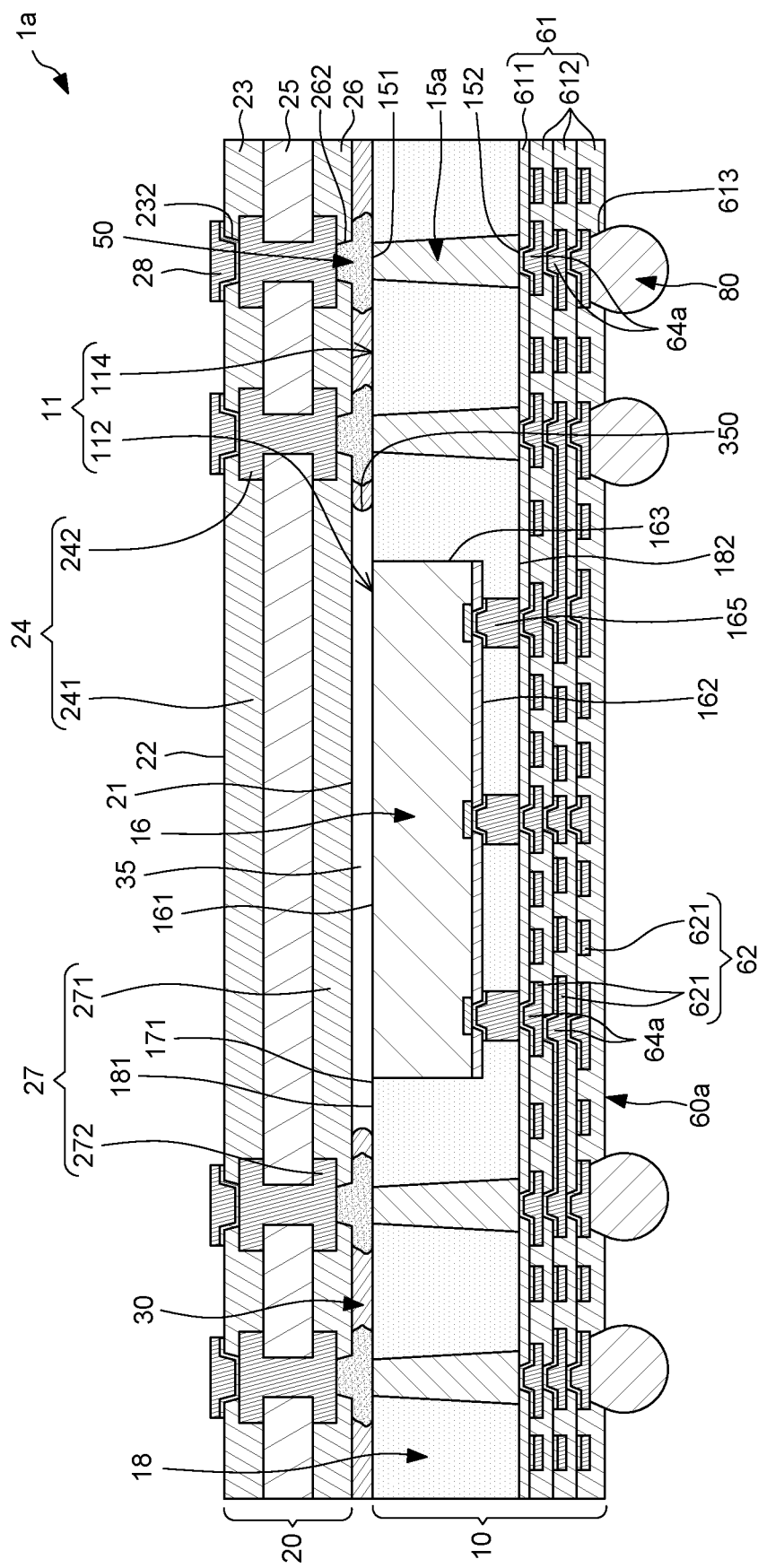
FIG. 4 illustrates a cross-sectional view of an electronic package structure according to some embodiments of the present disclosure.

FIG. 4 illustrates a cross-sectional view of an electronic package structure 1a according to some embodiments of the present disclosure. The electronic package structure 1a of FIG. 4 is similar to the electronic package structure 1 of FIG. 1, except that the bonding pads 66 of the redistribution structure 60, the bonding material 95 and the underfill 17 are omitted. In some embodiments, as shown in FIG. 4, the conductive pads 165 of the semiconductor element 16 and the conductive pillars 15a may contact the redistribution structure 60a directly. The conductive pads 165 of the semiconductor element 16 and the conductive pillars 15a may be bonded to the inner vias 64a of the redistribution structure 60a directly. The inner vias 64a may taper upward. That is, a width of each of the inner vias 64a may gradually decrease toward the corresponding conductive pad 165 or the corresponding conductive pillar 15a. In addition, bottom surfaces of the conductive pads 165 may be substantially coplanar with the lower surface 182 of the encapsulant 18 and bottom surfaces 152 of the conductive pillars 15a. In some embodiments, the conductive pillars 15a may taper upward. That is, a width of each of the conductive pillars 15a may gradually decrease toward the corresponding inner via 64a.

Figure 4A:
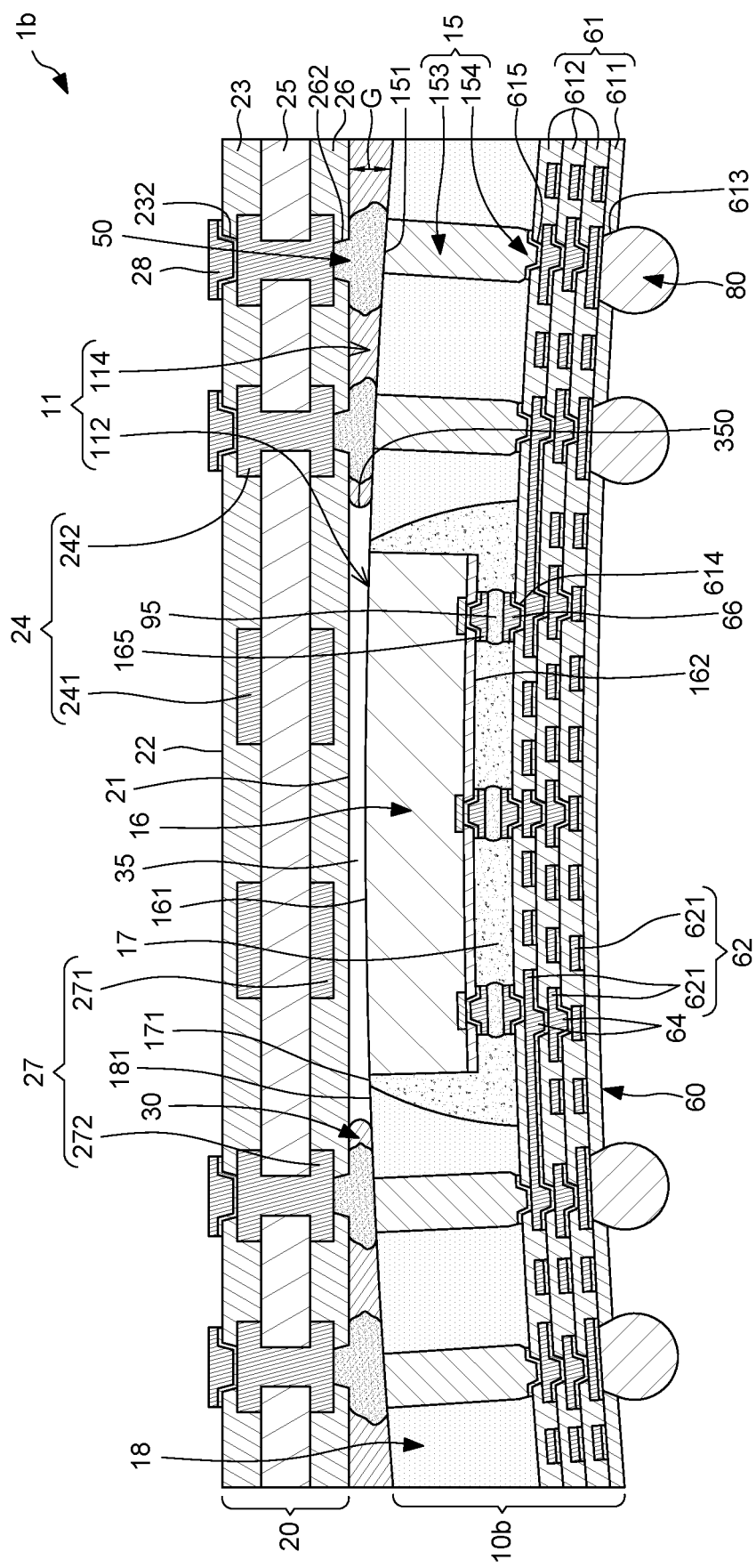
FIG. 4A illustrates a cross-sectional of an electronic package structure according to some embodiments of the present disclosure.

FIG. 4A illustrates a cross-sectional view of an electronic package structure 1b according to some embodiments of the present disclosure. The electronic package structure 1b of FIG. 4A is similar to the electronic package structure 1 of FIG. 1, except for a structure of the electronic structure 10b.

As shown in FIG. 4A, the electronic structure 10b curves or warps toward the wiring structure 20. That is, the top surface 11 of the electronic structure 10b is a curved surface. The electrical contacts 50 may be squashed on the curved surface (i.e., the top surface 11). In some embodiments, a bottom surface of the electronic structure 10b may also be a curved surface. In addition, a space G between the wiring structure 20 and the electronic structure 10b may gradually increase outward.

Figure 4B:
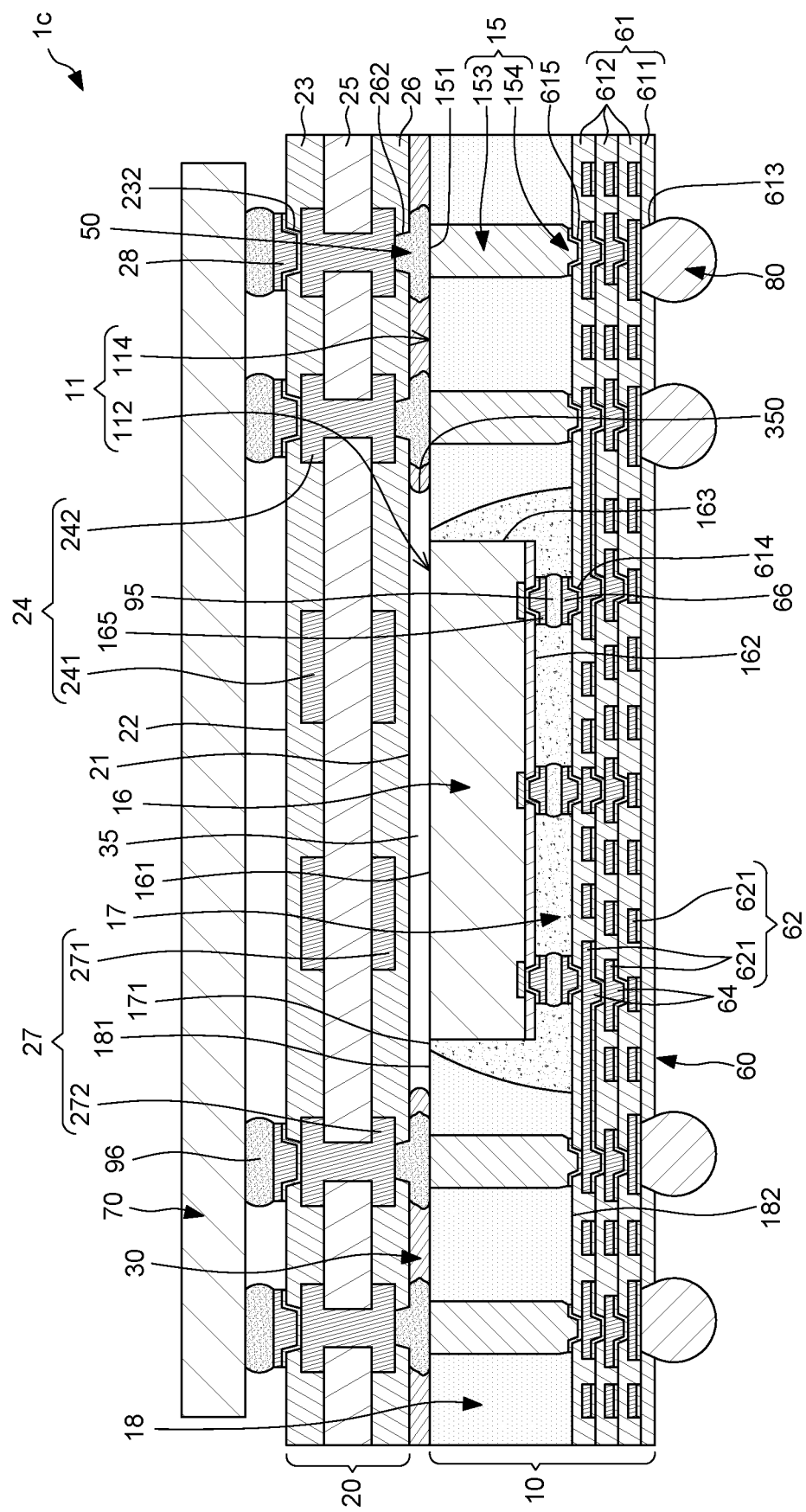
FIG. 4B illustrates a cross-sectional view of an electronic package structure according to some embodiments of the present disclosure.

FIG. 4B illustrates a cross-sectional view of an electronic package structure 1c according to some embodiments of the present disclosure. The electronic package structure 1c of FIG. 4B is similar to the electronic package structure 1 of FIG. 1, except that the electronic package structure 1c further includes an electronic device 70. The electronic device 70 may be, for example, a memory die. Accordingly, the semiconductor element 16 may be, for example, an application specific integrated circuit (ASIC) die. As shown in FIG. 4B, the electronic device 70 may be disposed adjacent to the wiring structure 20 and electrically connected to the wiring structure 20. In some embodiments, the electronic device 70 may be electrically connected to the bonding pads 28 of the wiring structure 20 through a plurality of electrical connectors 96. Thus, the electronic device 70 (e.g., the memory die) may be electrically connected to the semiconductor element 16 (e.g., the ASIC die) through the wiring structure 20.

Figure 4C:
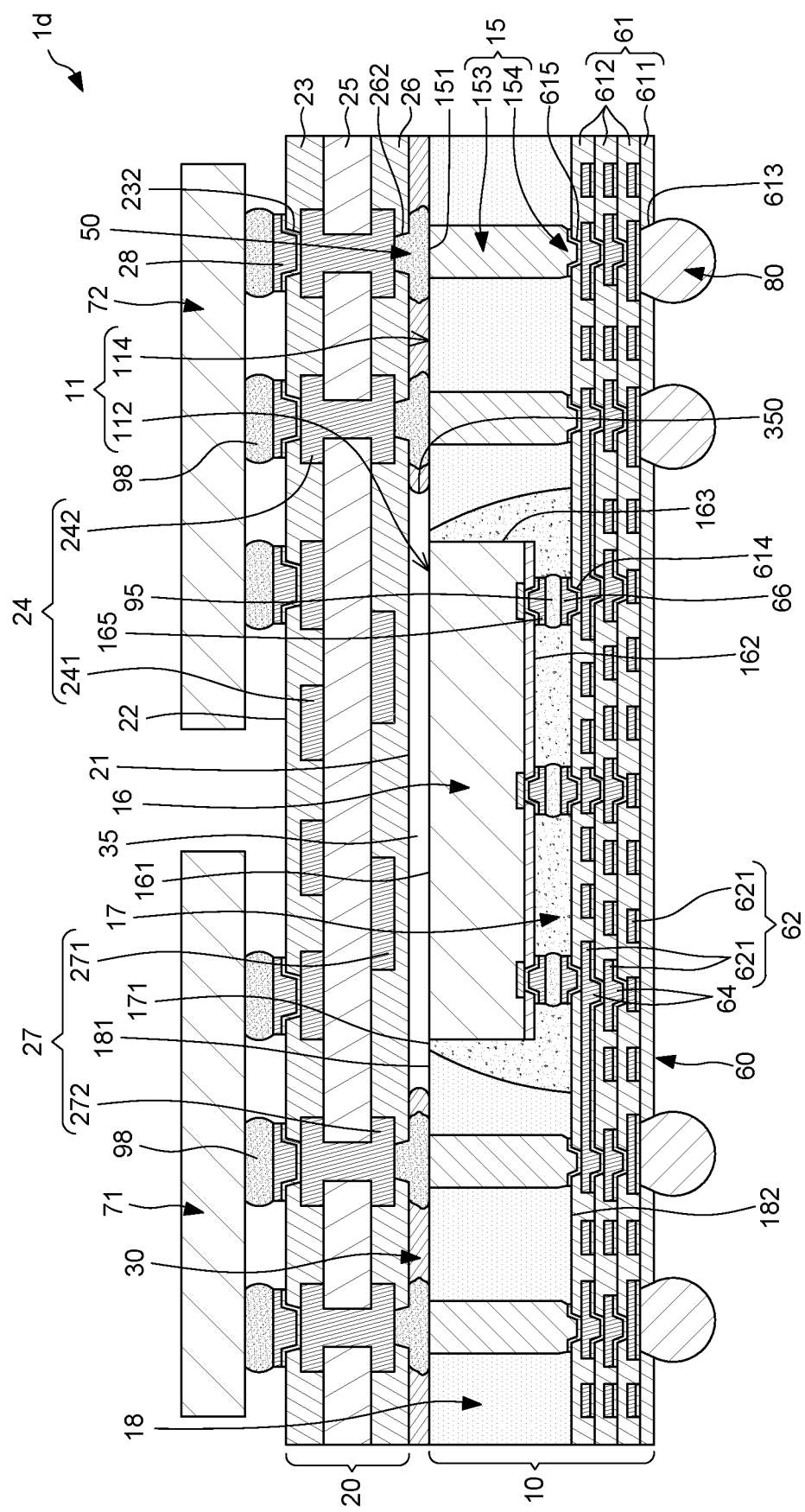
FIG. 4C illustrates a cross-sectional view of an electronic package structure according to some embodiments of the present disclosure.

FIG. 4C illustrates a cross-sectional view of an electronic package structure 1d according to some embodiments of the present disclosure. The electronic package structure 1d of FIG. 4C is similar to the electronic package structure 1 of FIG. 1, except that the electronic package structure 1d further includes a first electronic device 71 and a second electronic device 72. The first electronic device 71 may be, for example, an application specific integrated circuit (ASIC) die. The second electronic device 72 may be, for example, a memory die. As shown in FIG. 4C, the first electronic device 71 and the second electronic device 72 may be disposed adjacent to the wiring structure 20 and electrically connected to the wiring structure 20. In some embodiments, the first electronic device 71 and the second electronic device 72 may be electrically connected to the bonding pads 28 of the wiring structure 20 through a plurality of electrical connectors 98. In addition, the second electronic device 72 (e.g., the memory die) may be electrically connected to the first electronic device 71 (e.g., the ASIC die) through the semiconductor element 16 (e.g., the bridge die).

Figure 4D:
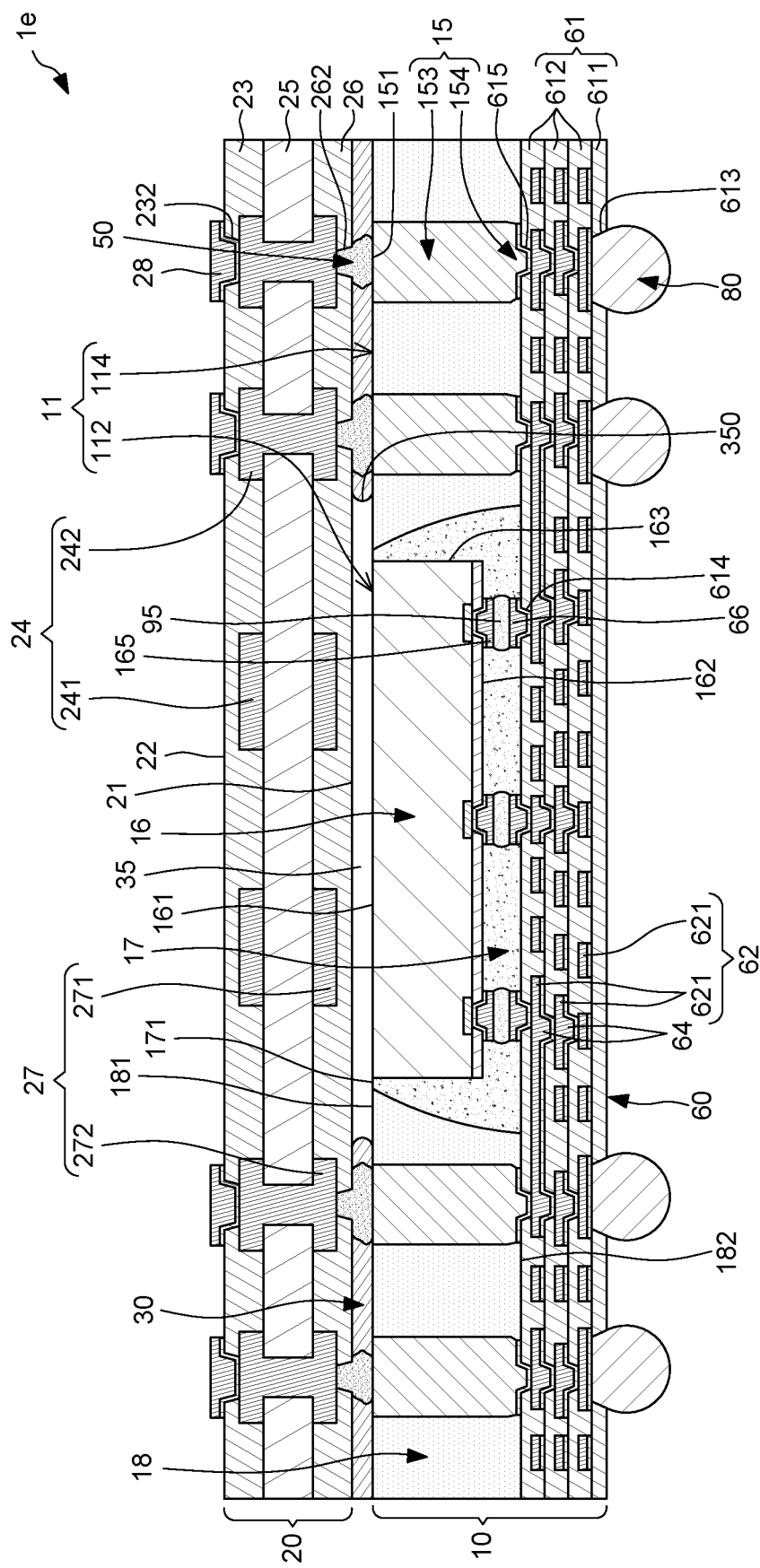
FIG. 4D illustrates a cross-sectional view of an electronic package structure according to some embodiments of the present disclosure.

FIG. 4D illustrates a cross-sectional view of an electronic package structure 1e according to some embodiments of the present disclosure. The electronic package structure 1e of FIG. 4D is similar to the electronic package structure 1 of FIG. 1, except that contact areas between the conductive pillars 15 and the electrical contacts 50. As shown in FIG. 4D, the contact areas between the conductive pillars 15 and the electrical contacts 50 may gradually decrease outward.

Figure 4E:
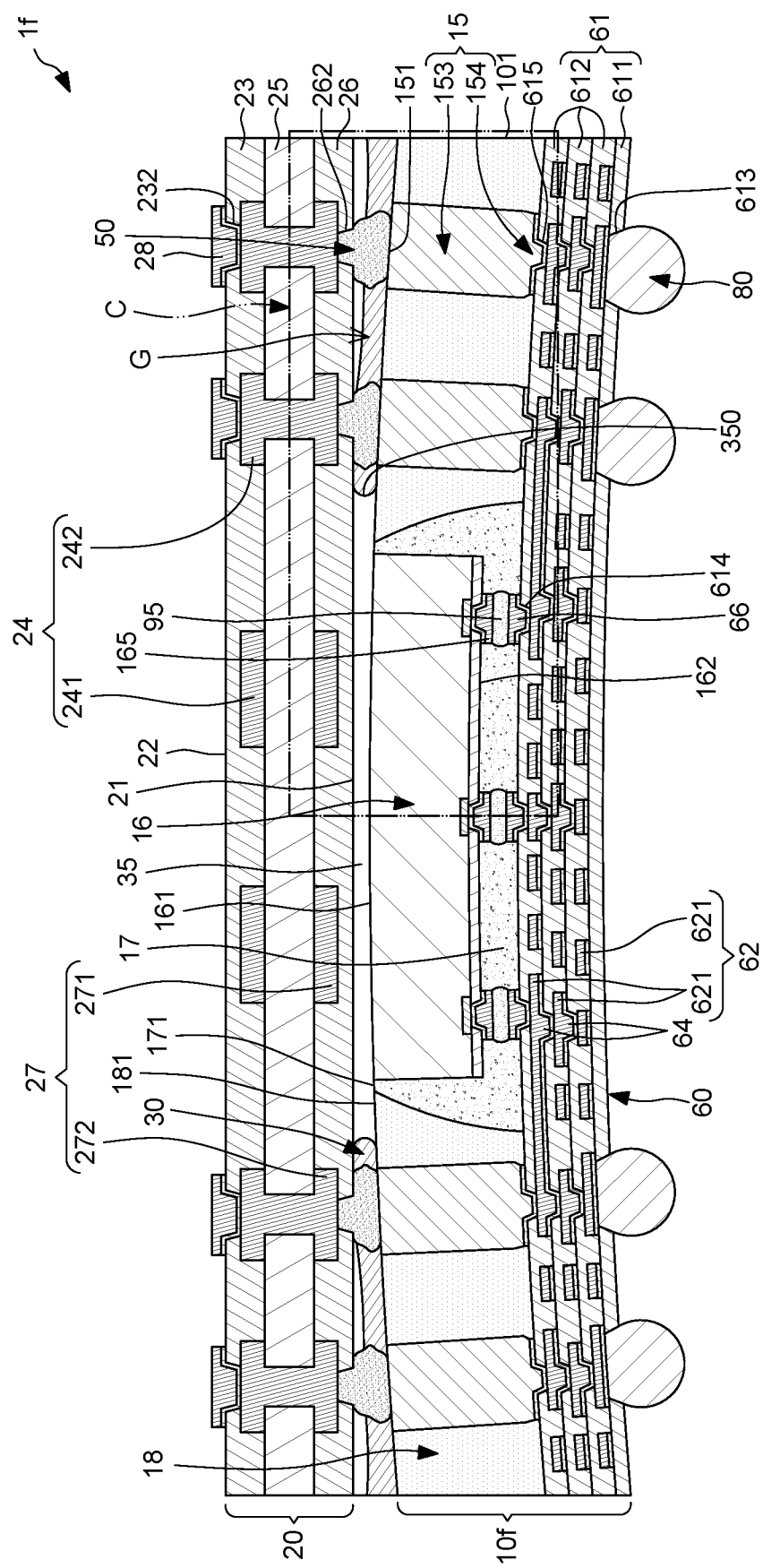
FIG. 4E illustrates a cross-sectional view of an electronic package structure according to some embodiments of the present disclosure.
Figure 4F:
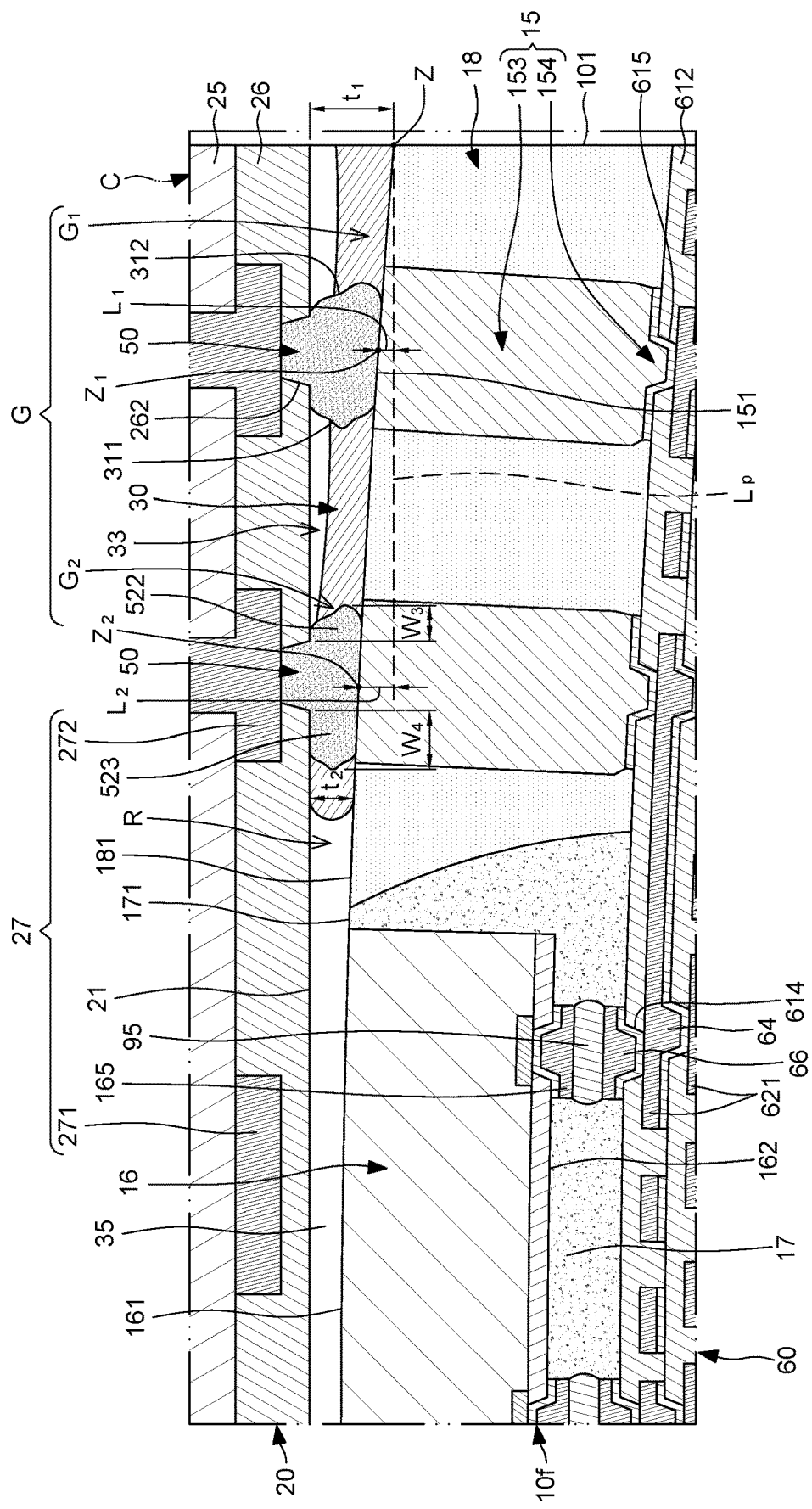
FIG. 4F illustrates an enlarged view of an area "C" of FIG. 4E.
Figure 4H:
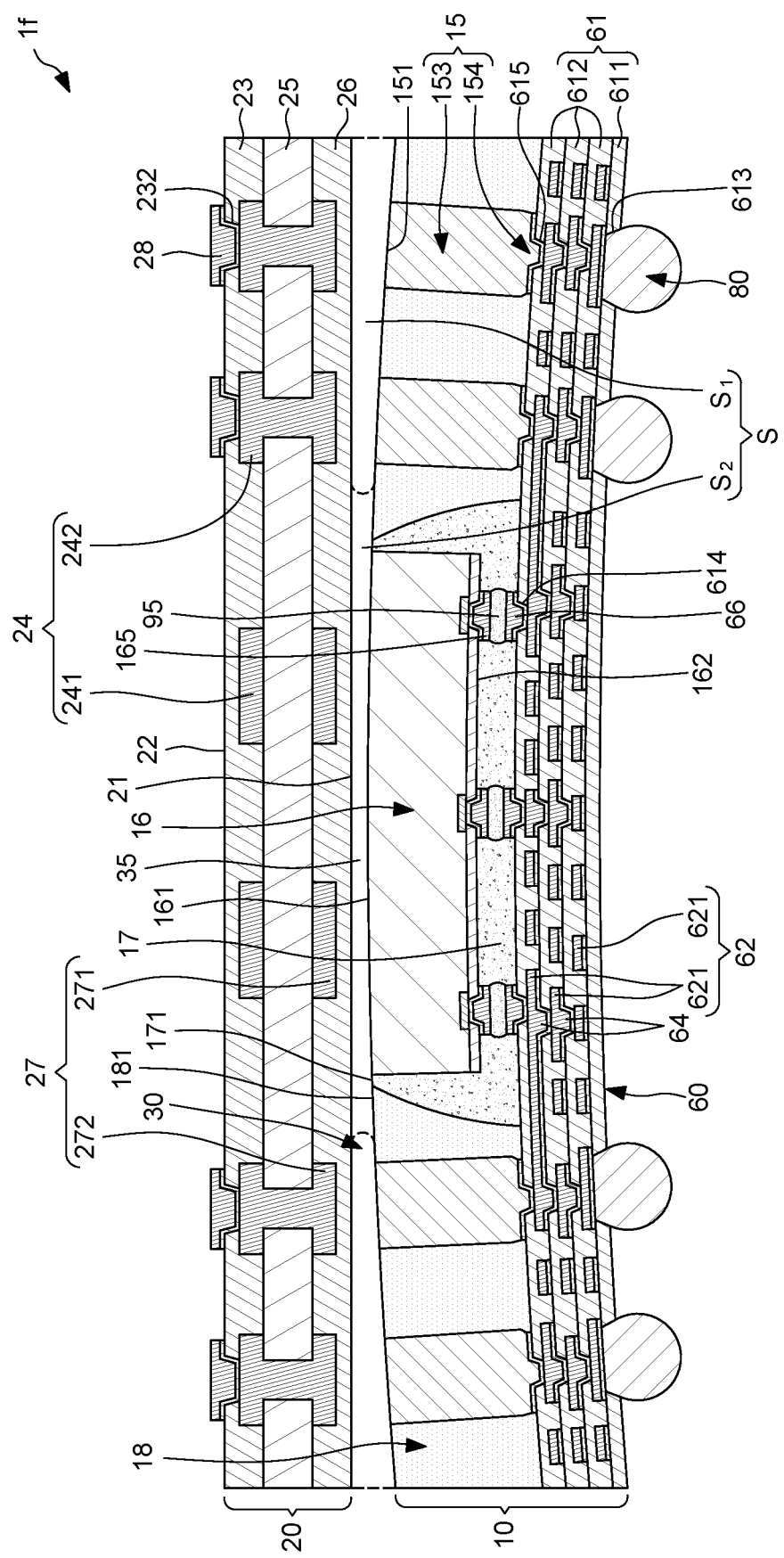
FIG. 4H illustrates a cross-sectional view along line X-X of FIG. 4G.

FIG. 4E illustrates a cross-sectional view of an electronic package structure 1f according to some embodiments of the present disclosure. FIG. 4F illustrates an enlarged view of an area "C" of FIG. 4E. FIG. 4G illustrates a top view of FIG. 4E. FIG. 4H illustrates a cross-sectional view along line X-X of FIG. 4G. The electronic package structure if of FIG. 4E is similar to the electronic package structure 1b of FIG. 4A, except for a structure of the electronic structure 10f and contact areas between the conductive pillars 15 and the electrical contacts 50. As shown in FIG. 4E, the electronic structure 10f curves toward the wiring structure 20. That is, the top surface 11 of the electronic structure 10f is a curved surface. The electrical contacts 50 may be squashed on the curved surface (i.e., the top surface 11). In addition, the support layer 30 may contact the curved surface. That is, an interface between the support layer 30 and the electronic structure 10f may include the curved surface. Further, an elevation of a bottom surface of the support layer 30 may gradually decrease toward the lateral surface 101 of the electronic structure 10f. In some embodiments, a bottom surface of the electronic structure 10f may also be a curved surface. The contact areas between the conductive pillars 15 and the electrical contacts 50 may gradually decrease outward.

In addition, a space G may be between the wiring structure 20 and the electronic structure 10f. The space G may gradually increase outward. The space G may include a central region R. The support layer (i.e., the interlayer) 30 may be located in the space G and around the central region R. In some embodiments, the space G may include a first region G1 and a second region G2. The first region G1 is closer to the lateral surface (or the edge) 101 of the electronic structure 10f than the second region G2 is. The first region G1 has a first height. The second region G2 has a second height different form the first height. At least two electrical contacts 50 may be located respectively in the first region G1 and the second region G2. In some embodiments, as shown in FIG. 4F, a contact area between the electrical contact 50 in the first region G1 and the electronic structure 10f (e.g., the conductive pillar 15) may be narrower than a contact area between the electrical contact 50 in the second region G2 and the electronic structure 10f (e.g., the conductive pillar 15) in a cross-sectional view. That is, contact areas between the conductive pillars 15 and the electrical contacts 50 may gradually decrease outward. In addition, a thickness of the electrical contact 50 in the first region G1 may be greater than a thickness of the electrical contact 50 in the second region G2. Further, a width of each of the electrical contacts 50 may be greater than a height thereof. A bottom surface of the electrical contact 50 in the first region G1 may have a first elevation $L_1$. The first elevation $L_1$ is a vertical distance from a center $Z_1$ of the bottom surface of the electrical contact 50 in the first region G1 to a level plane $L_p$ passing through a lowest point Z of the support layer 30. A bottom surface of the electrical contact 50 in the second region G2 may have a second elevation $L_2$. The second elevation $L_2$ is a vertical distance from a center $Z_2$ of the bottom surface of the electrical contact 50 in the second region G2 to the level plane $L_p$. The first elevation $L_1$ may be different from the second elevation $L_2$. In some embodiments, the first elevation $L_1$ may be lower than the second elevation $L_2$. In some embodiments, as shown in FIG. 4F, the width $W_4$ of the second extending portion 523 of the electrical contact 50 may be greater than the width $W_3$ of the first extending portion 522 of the electrical contact 50. In some embodiments, the width $W_4$ of the second extending portion 523 of the electrical contact 50 may be less than the width $W_3$ of the first extending portion 522 of the electrical contact 50.

In some embodiments, the support layer 30 may have a first thickness $t_1$ more adjacent to the lateral surface 101 of the electronic structure 10f and a second thickness $t_2$ farther away from the lateral surface 101 of the electronic structure 10f. The first thickness $t_1$ may be greater than the second thickness $t_2$. That is, the thickness of the support layer 30 may gradually increase outward. In addition, the support layer 30 may not contact the electrical contact 50, thus the support layer 30 may include a first inner surface 311 facing the electrical contact 50 and a second inner surface 312 opposite to the first inner surface 311. A profile of the second inner surface 312 may be different from a profile of the first inner surface 311.

In some embodiments, as shown in FIGS. 4E and 4F, a gap 33 may be located between the support layer 30 and the wiring structure 20. A height of the gap 33 may gradually increase toward an edge of the wiring structure 20. In addition, the gap 33 may be in communication with a lateral surface of the support layer 30. That is, the gap 33 may extend to outside of the electronic package structure 1f.

In some embodiments, as shown in FIG. 4G, a channel S may be located in the space G and divide the support layer (i.e., the interlayer) 30 to form a plurality of separated portions (including, for example, separated portions 301, 302, 303 and 304). The separated portions (e.g., the separated portions 301, 302, 303 and 304) may be disposed symmetrically against the central region R of the space G. In addition, the channel S may extend to outside of the electronic package structure 1f. In some embodiments, the channel S may include a first portion $S_1$ more adjacent to the lateral surface (or the edge) 101 of the electronic structure 10f and a second portion $S_2$ farther away from the lateral surface (or the edge) 101 of the electronic structure 10f. That is, the second portion $S_2$ is closer to the central region R of the space G than the first portion $S_1$ is. A width of the first portion $S_1$ may gradually increase toward the lateral surface (or the edge) 101 of the electronic structure 10f. As shown in FIG. 4H, a height of the first portion $S_1$ may be greater than a height of the second portion $S_2$. In some embodiments, as shown in FIG. 4G, the first portion $S_1$ may include a plurality of regions (including, for example, regions $S_{11}$, $S_{12}$, $S_{13}$ and $S_{14}$) in communication with the second portion $S_2$. The regions (e.g., the regions $S_{11}$, $S_{12}$, $S_{13}$ and $S_{14}$) may be disposed symmetrically with respect to the second portion $S_2$.

FIG. 5 through FIG. 15 illustrate a method for manufacturing an electronic package structure according to some embodiments of the present disclosure. In some embodiments, the method is for manufacturing the electronic package structure 1 shown in FIG. 1.

Figure 5:
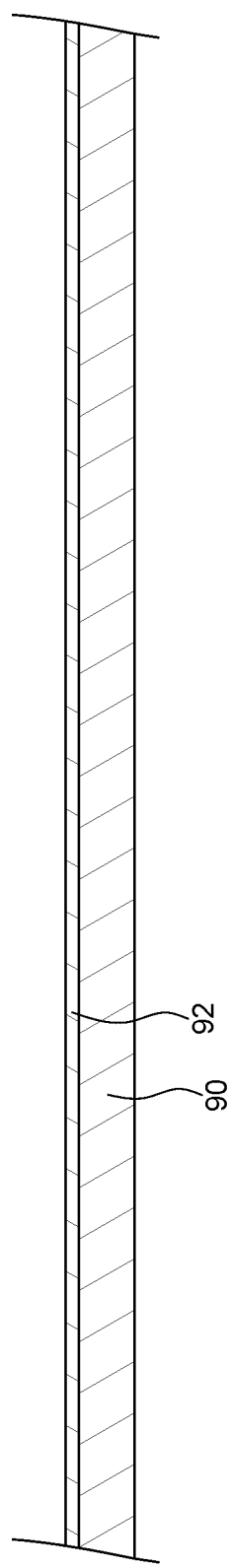
FIG. 5 illustrates one or more stages of an example of a method for manufacturing an electronic package structure according to some embodiments of the present disclosure.

Referring to FIG. 5 through FIG. 10, an electronic structure 10' is provided. Referring to FIG. 5, a carrier 90 is provided. The carrier 90 may be in a wafer type or strip type. The carrier 90 may include a release layer 92 disposed thereon.

Figure 6:
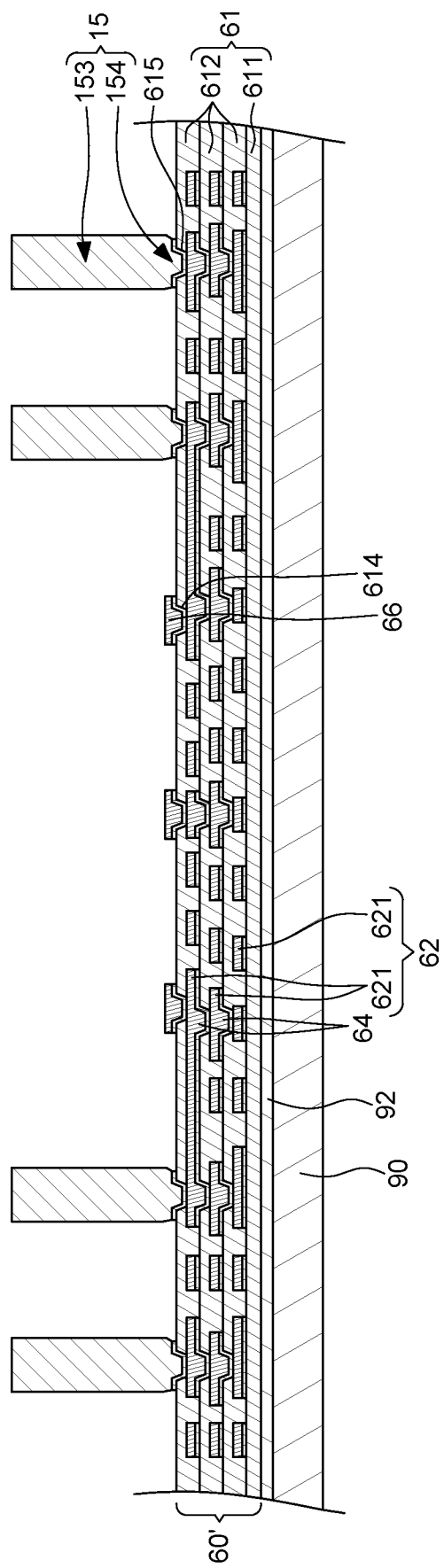
FIG. 6 illustrates one or more stages of an example of a method for manufacturing an electronic package structure according to some embodiments of the present disclosure.

Referring to FIG. 6, a redistribution structure 60' is formed or disposed on the release layer 92 on the carrier 90, and then a plurality of conductive pillars 15 are formed or disposed on the redistribution structure 60'. The redistribution structure 60' of FIG. 6 may be similar to the redistribution structure 60 of FIG. 1, and may include a dielectric structure 61, a redistribution layer 62, a plurality of inner vias 64 and a plurality of bonding pads 66. The dielectric structure 61 may include a plurality of dielectric layers (including, for example, one first dielectric layer 611 and three second dielectric layers 612). The second dielectric layers 612 is formed on a top surface of the first dielectric layer 611 and stacked on one another. The first dielectric layer 611 and the second dielectric layers 612 may be made of a cured photoimageable dielectric (PID) material such as epoxy or polyimide (PI) including photoinitiators. The redistribution layer 62 is embedded in the dielectric structure 61 and may include a plurality of circuit layers 621. The inner vias 64 electrically connect at least one circuit layer 621 or two adjacent circuit layers 621 of the redistribution layer 62. In some embodiments, the inner vias 64 may taper downward. That is, a width of each of the inner vias 64 may gradually decrease toward the first dielectric layer 611. In addition, the first dielectric layer 611 may define a plurality of openings 613 extending through the first dielectric layer 611 to expose portions of the bottommost circuit layer 621 of the redistribution layer 62. The topmost second dielectric layer 612 may cover the topmost circuit layer 621, and may define a plurality of openings (including, for example, openings 614 and openings 615) to expose portions of the topmost circuit layer 621. The bonding pads 66 are formed in the openings 614 of the topmost second dielectric layer 612 and on the exposed portions of the topmost circuit layer 621.

The conductive pillars 15 are formed in the openings 615 of the topmost second dielectric layer 612 and on the exposed portions of the topmost circuit layer 621. A material of the conductive pillar 15 may be, for example, copper, silver (Ag), gold (Au) or other high conductivity metals or alloy. In the present embodiment, the material of the conductive pillar 15 is copper. The conductive pillars 15 of FIG. 6 may be similar to the conductive pillars 15 of FIG. 1 and FIG. 2, and each of the conductive pillars 15 has a top surface 151 and may include an upper portion 153 and a lower portion 154 below the upper portion 153.

Figure 7:
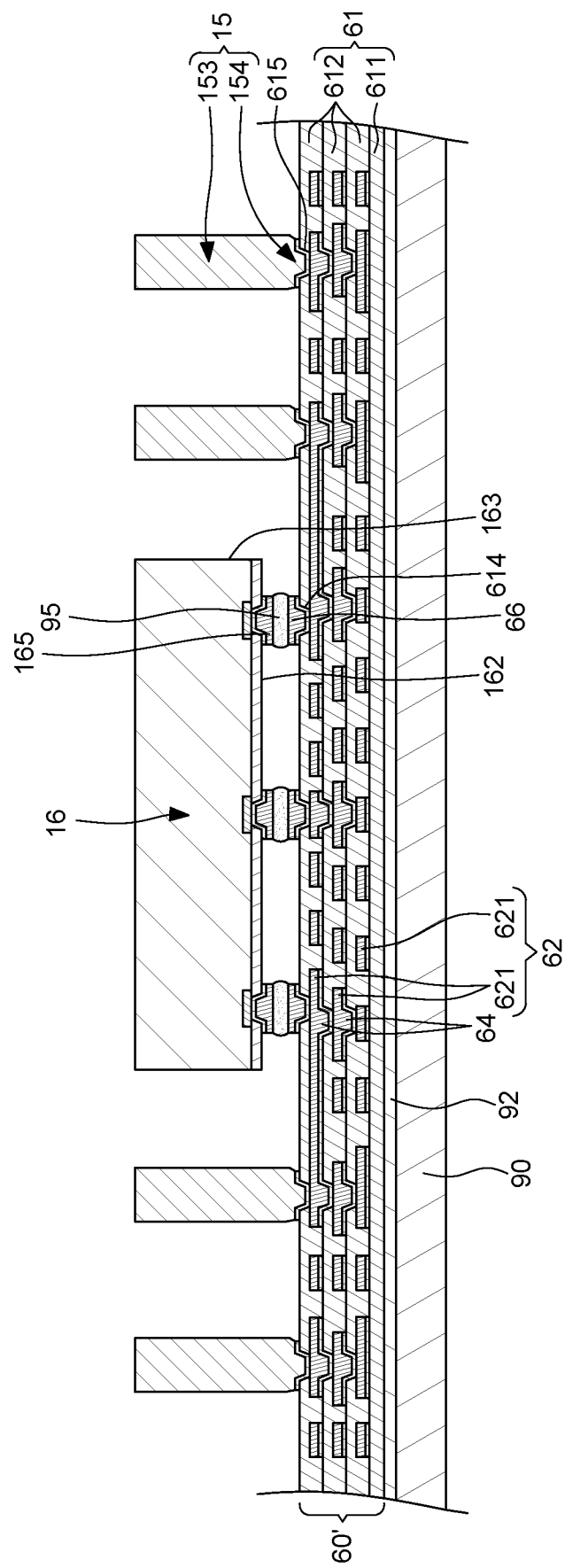
FIG. 7 illustrates one or more stages of an example of a method for manufacturing an electronic package structure according to some embodiments of the present disclosure.

Referring to FIG. 7, at least one semiconductor element 16 is disposed adjacent to the redistribution structure 60' and electrically connected to the redistribution structure 60'. The semiconductor element 16 may be, for example, a bridge die. The semiconductor element 16 has a lower surface 162 (e.g., active surface), and may include a plurality of conductive pads 165 disposed adjacent to the lower surface 162. A material of the conductive pad 165 may be, for example, aluminum (Al) tin (Sn), lead (Pb) or other low conductivity metals or alloy. In the present embodiment, the material of the conductive pad 165 is aluminum (Al). In some embodiments, the conductive pads 165 of the semiconductor element 16 may be bonded to the bonding pads 66 of the redistribution structure 60' through a bonding material 95.

Figure 8:
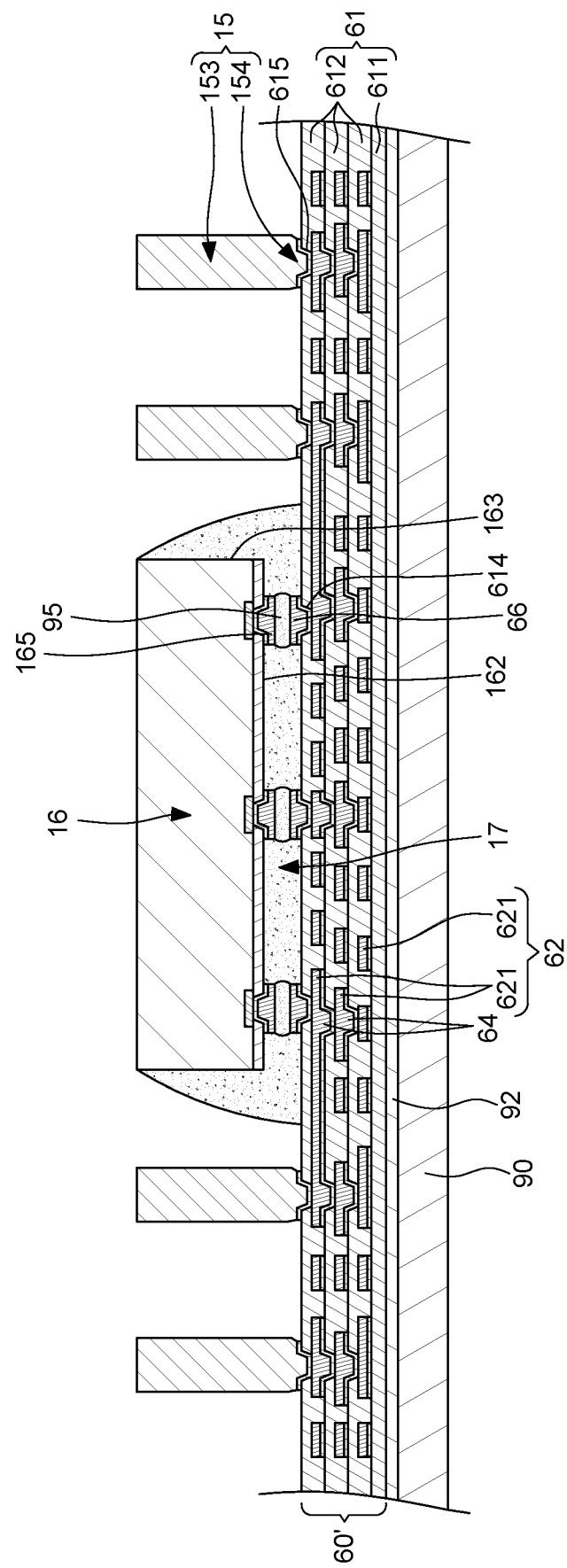
FIG. 8 illustrates one or more stages of an example of a method for manufacturing an electronic package structure according to some embodiments of the present disclosure.

Referring to FIG. 8, an underfill 17 is formed on the redistribution structure 60' to cover the bonding pads 66 of the redistribution structure 60', the bonding material 95 and a portion (e.g., the conductive pads 165, the lower surface 162 and a lateral surface 163) of the semiconductor element 16.

Figure 9:
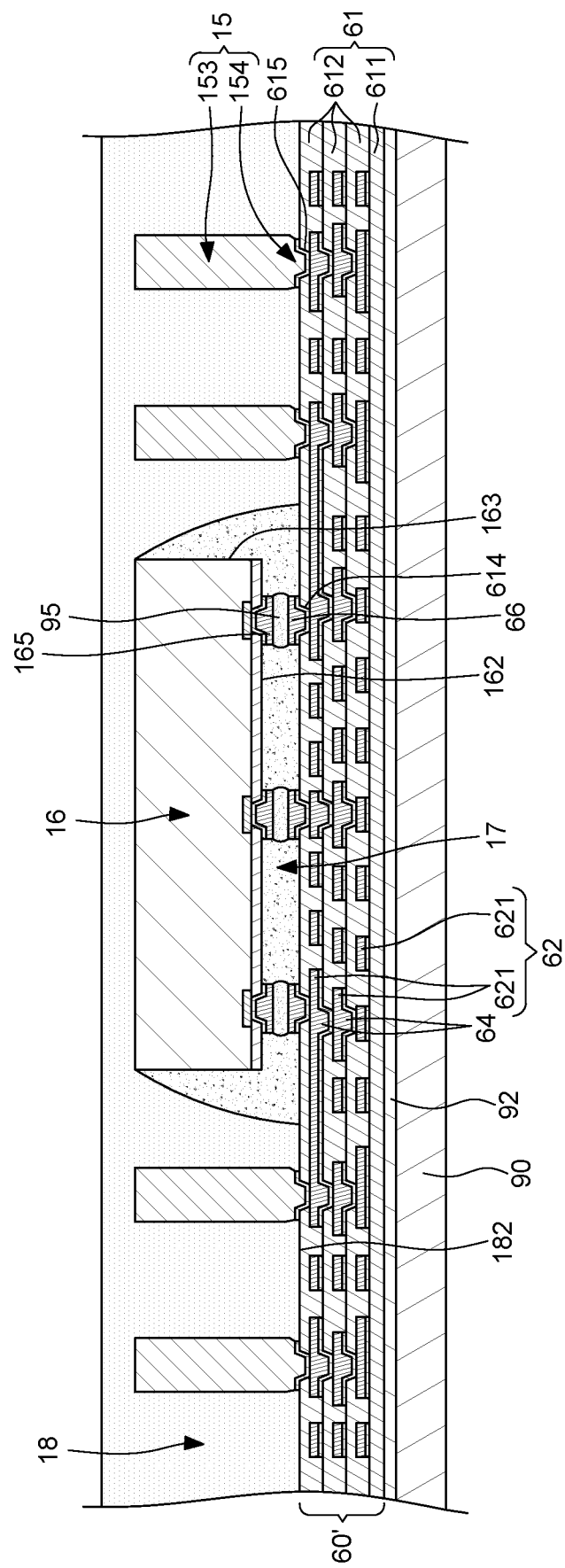
FIG. 9 illustrates one or more stages of an example of a method for manufacturing an electronic package structure according to some embodiments of the present disclosure.

Referring to FIG. 9, an encapsulant 18 is formed on the redistribution structure 60' to encapsulate the semiconductor element 16, the conductive pillars 15 and the underfill 17. A material of the encapsulant 18 may be a molding compound with or without fillers. The encapsulant 18 has a lower surface 182.

Figure 10:
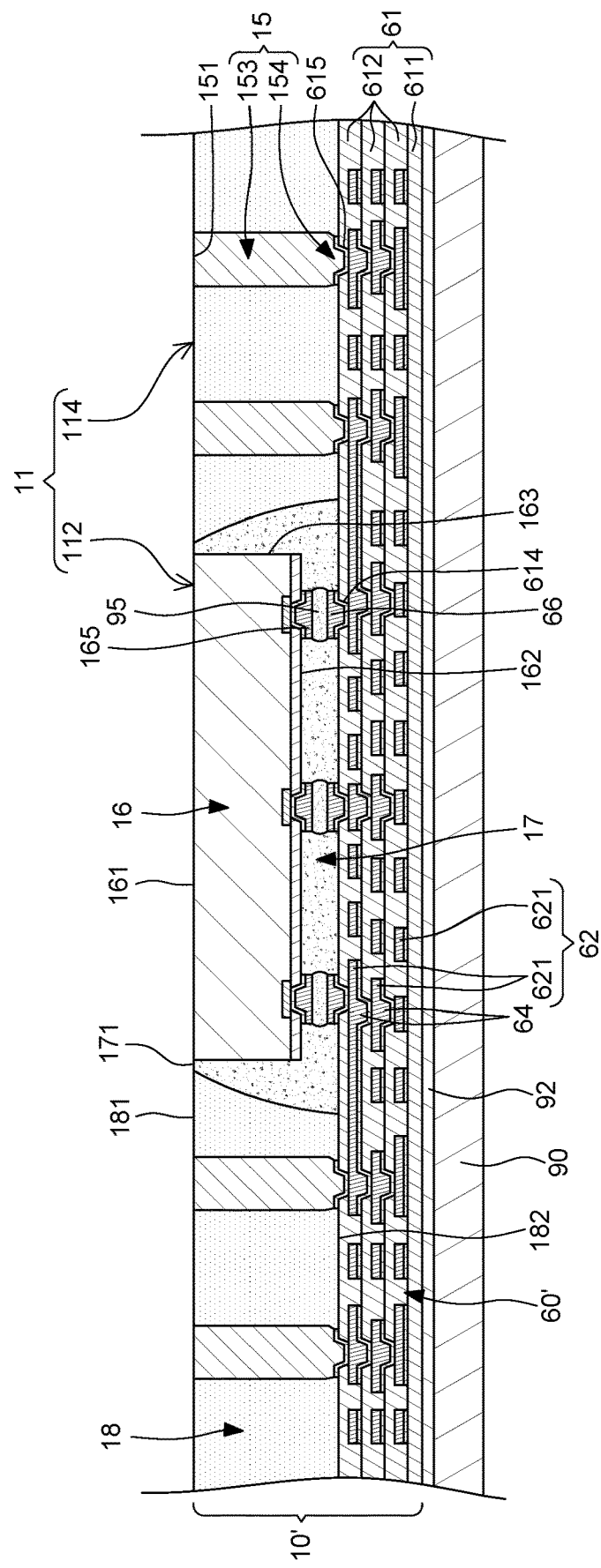
FIG. 10 illustrates one or more stages of an example of a method for manufacturing an electronic package structure according to some embodiments of the present disclosure.

Referring to FIG. 10, a portion of the encapsulant 18 is removed through, for example, grinding. Further, a portion (e.g., the upper surface 161) of the semiconductor element 16, a portion (e.g., the top surface 151) of each of the conductive pillars 15 and a portion (e.g., the top surface 171) of the underfill 17 may be exposed from an upper surface 181 of the encapsulant 18. Meanwhile, the electronic structure 10' is formed. The electronic structure 10' has a top surface 11. The top surface 11 includes the upper surface 181 of the encapsulant 18, the upper surface 161 of the semiconductor element 16, the top surfaces 151 of the conductive pillars 15 and the top surface 171 of the underfill 17. The top surface 11 may define a low-density region 112 and a high-density region 114 around the low-density region 112. The low-density region 112 corresponds to the semiconductor element 16. The high-density region 114 corresponds to the conductive pillars 15. In some embodiments, the upper surface 181 of the encapsulant 18 may be substantially coplanar with the upper surface 161 of the semiconductor element 16, the top surface 151 of each of the conductive pillars 15 and the top surface 171 of the underfill 17.

Figure 11:
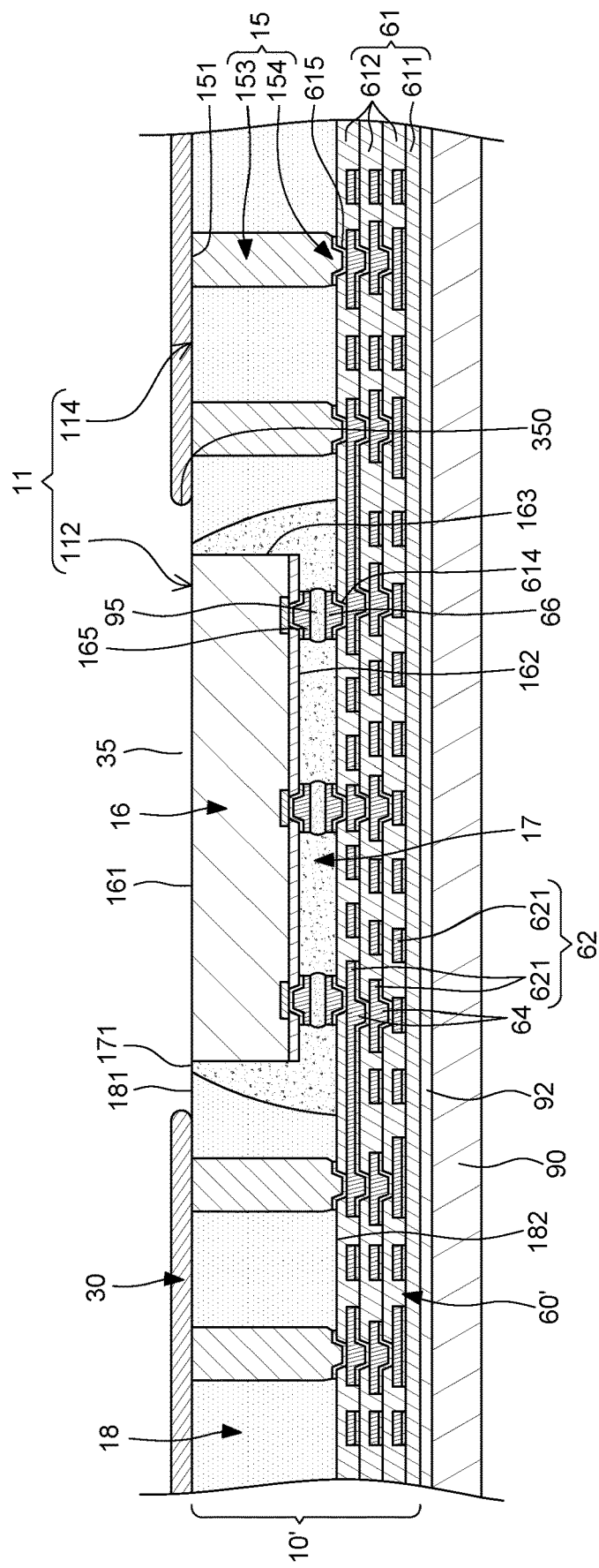
FIG. 11 illustrates one or more stages of an example of a method for manufacturing an electronic package structure according to some embodiments of the present disclosure.

Referring to FIG. 11, a support layer 30 is formed on a portion of the top surface 11 of the electronic structure 10' to cover the exposed portions (e.g., the top surfaces 151) of the conductive pillars 15 and a portion of the upper surface 181 of the encapsulant 18. The support layer 30 may be, for example, epoxy flux. The support layer 30 may define at least one opening 35 extending through the support layer 30 to expose the exposed portion (e.g., the upper surface 161) of the semiconductor element 16 and the exposed portion (e.g., the top surface 171) of the underfill 17. That is, the support layer 30 is formed on the high-density region 114 of the top surface 11 of the electronic structure 10' and exposes the low-density region 112. In some embodiments, the opening 35 of the support layer 30 may further expose a portion of the upper surface 181 of the encapsulant 18. In addition, a sidewall 350 of the opening 35 may curve inward.

Figure 12:
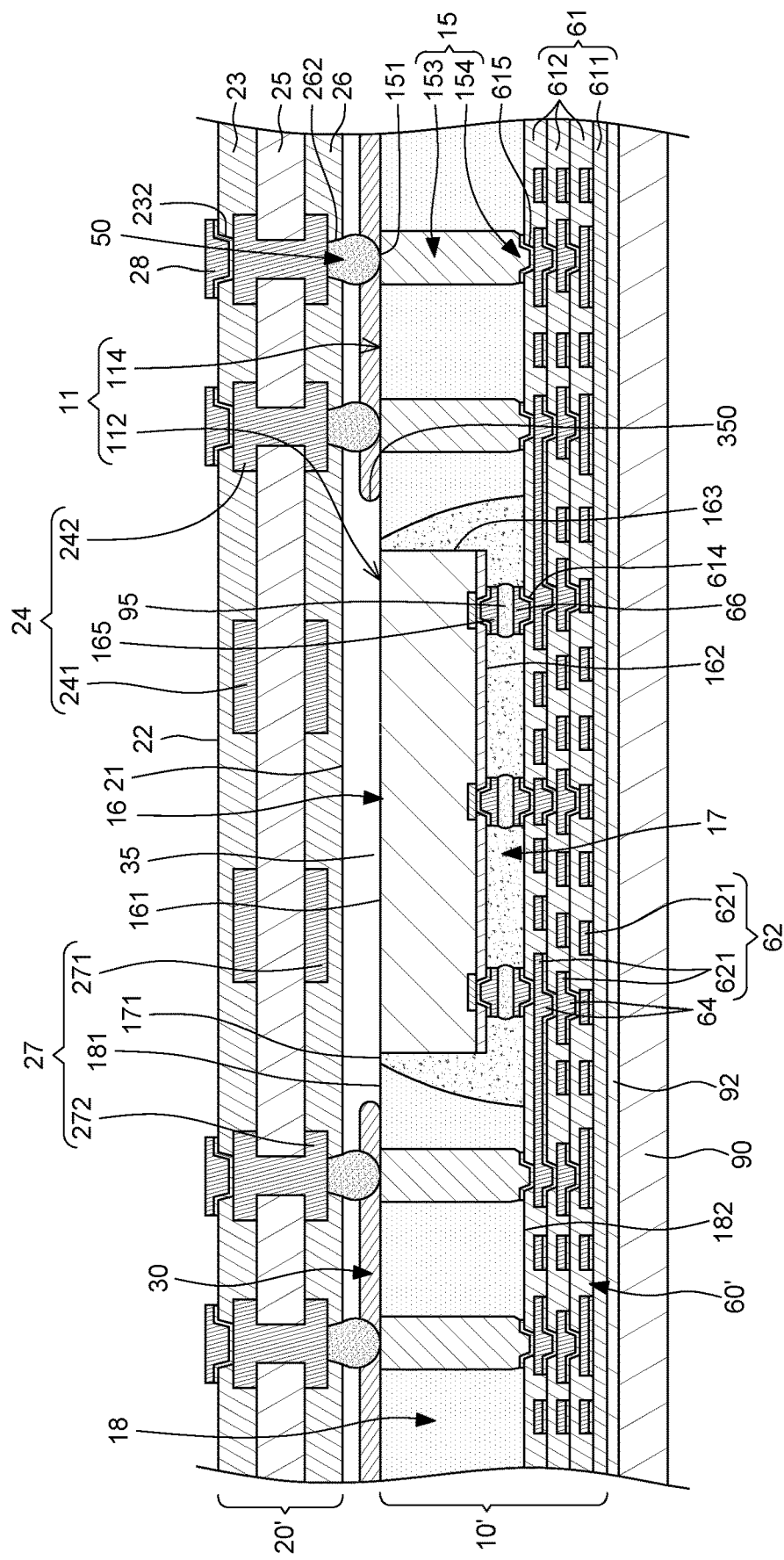
FIG. 12 illustrates one or more stages of an example of a method for manufacturing an electronic package structure according to some embodiments of the present disclosure.

Referring to FIG. 12, a wiring structure 20' is disposed on the conductive pillars 15 of the electronic structure 10' through a plurality of electrical contacts 50. The wiring structure 20' may be, for example, a substrate interposer. The wiring structure 20' of FIG. 12 may be similar to the wiring structure 20 of FIG. 1. As shown in FIG. 12, the electrical contacts 50 extend through the support layer 30 and are disposed on the conductive pillars 15 of the electronic structure 10'. Since the support layer 30 is previously formed on the conductive pillars 15 of the electronic structure 10' before the wiring structure 20' is disposed on the electronic structure 10', the support layer 30 may cover and contact the electrical contacts 50.

Figure 13:
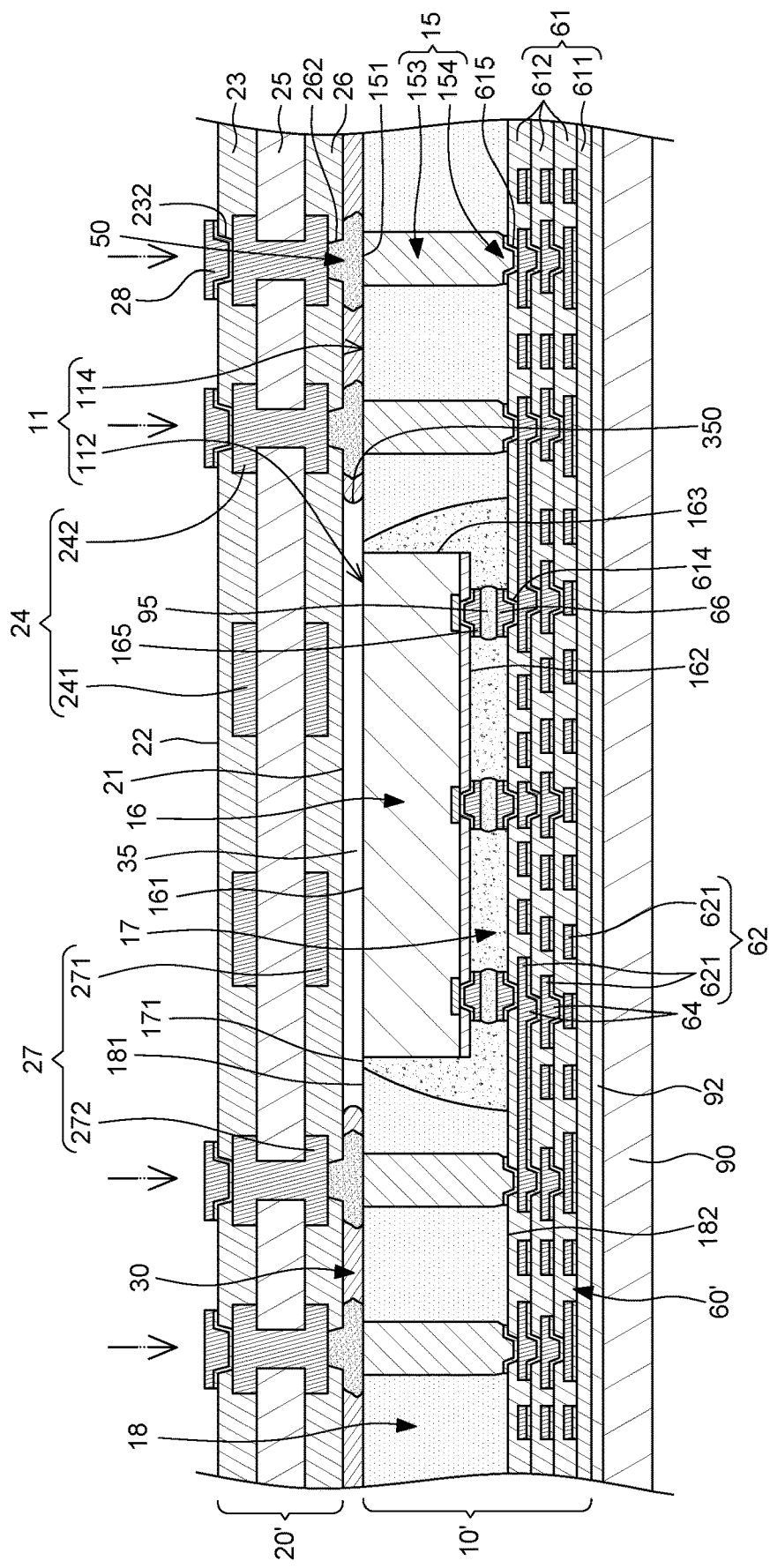
FIG. 13 illustrates one or more stages of an example of a method for manufacturing an electronic package structure according to some embodiments of the present disclosure.

Referring to FIG. 13, the wiring structure 20' is electrically connected and bonded to the conductive pillars 15 of the electronic structure 10' through the electrical contacts 50 after a thermocompression bonding. As shown in FIG. 13, the electrical contacts 50 are squashed on the conductive pillars 15. The electrical contacts 50 of FIG. 13 may be similar to the electrical contacts 50 of FIG. 1 and FIG. 3. The support layer 30 may be around each of the electrical contacts 50 to protect the small size electrical contacts 50. In addition, the thermocompression bonding may reduce the warpage and press the small size electrical contacts 50 to well joint with the electronic structure 10' (e.g., the conductive pillars 15) and the wiring structure 20' (e.g., the connecting pads 272).

Figure 14:
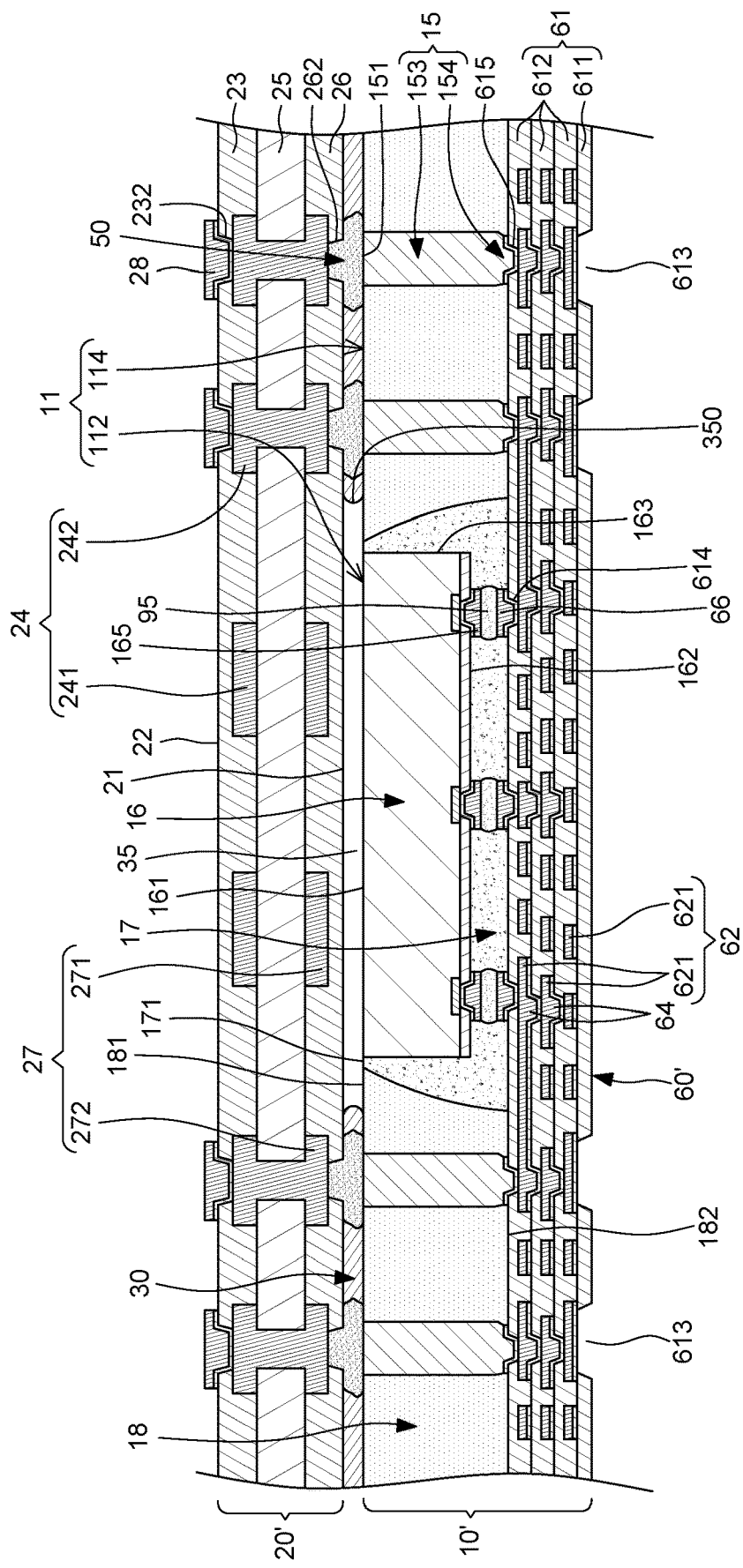
FIG. 14 illustrates one or more stages of an example of a method for manufacturing an electronic package structure according to some embodiments of the present disclosure.

Referring to FIG. 14, the carrier 90 and the release layer 92 are removed, and then the first dielectric layer 611 of the dielectric structure 61 of the redistribution structure 60' is patterned to form a plurality of openings 613 extending through the first dielectric layer 611 to expose portions of the bottommost circuit layer 621 of the redistribution layer 62.

Figure 15:
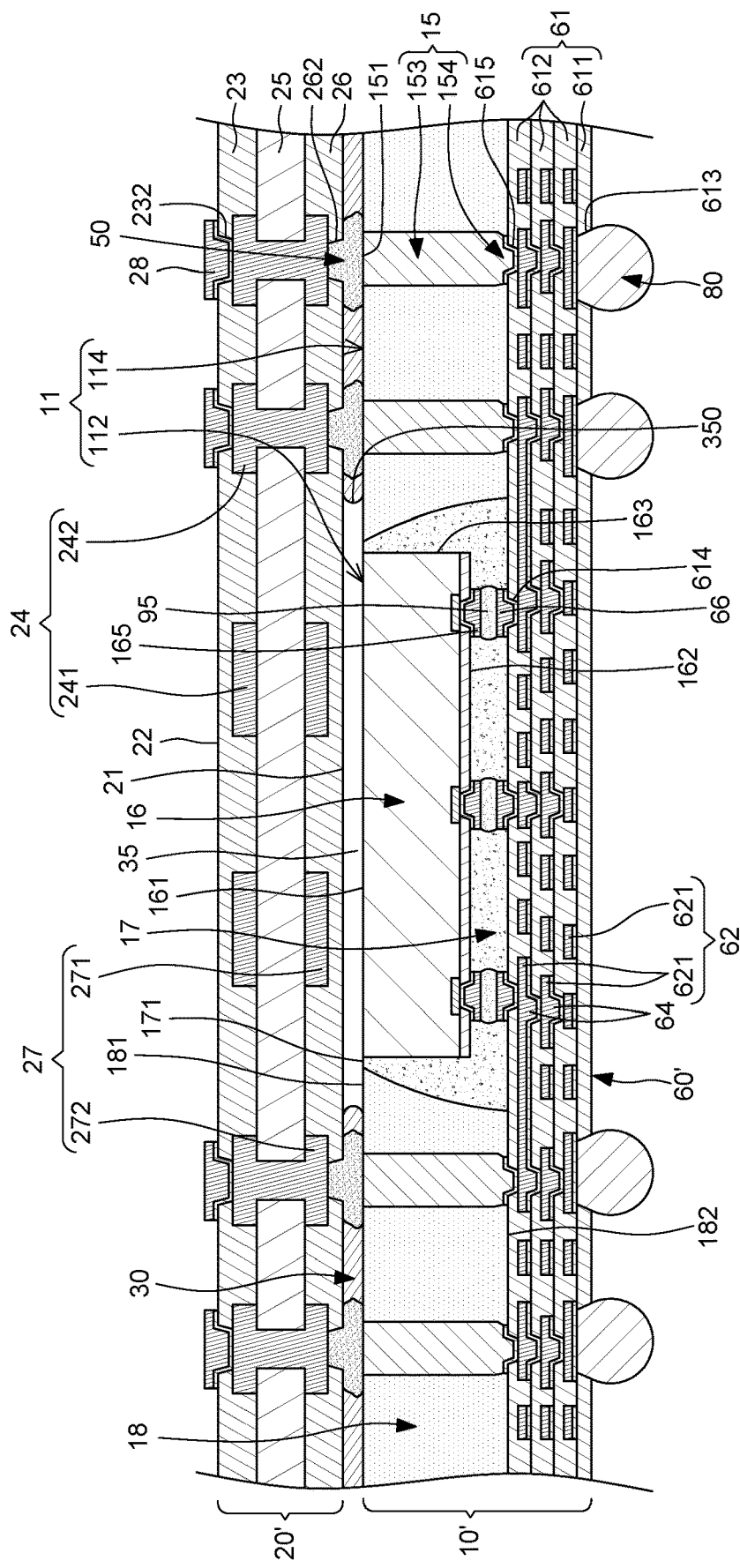
FIG. 15 illustrates one or more stages of an example of a method for manufacturing an electronic package structure according to some embodiments of the present disclosure.

Referring to FIG. 15, a plurality of electrical connectors 80 are formed or disposed in the openings 613 of the first dielectric layer 611 and mounted on the exposed portions of the bottommost circuit layer 621 of the redistribution layer 62 for external connection.

Then, a singulation process is conducted to obtain a plurality of electronic package structures 1 of FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package structure comprising:
   an electronic structure including an encapsulant encapsulating a semiconductor element;
   a wiring structure located over the electronic structure;
   an electrical contact connecting the wiring structure and the electronic structure, wherein the electrical contact includes a first side and a second side opposite to the first side; and
   a support layer disposed on the encapsulant and around the electrical contact, wherein, in a cross-sectional view, the semiconductor element is exposed by an opening defined by the support layer and dividing the support layer into a first portion and a second portion spaced apart from the first portion, the first side of the electrical contact is not exposed by the first portion of the support layer, and the second side of the electrical contact is partially exposed by the support layer, wherein the support layer is further around a second electrical contact, the second electrical contact includes a first side and a second side opposite to the first side of the second electrical contact, the first side of the second electrical contact faces the first side of the electrical contact, the first side of the second electrical contact is not exposed by the second portion of the support layer.

2. The electronic package structure of claim 1, wherein the first portion of the support layer has a first lateral surface facing a second lateral surface of the second portion of the support layer, wherein the first lateral surface includes a curved surface, and the second lateral surface includes a curved surface.

3. The electronic package structure of claim 1, wherein, in the cross-sectional view, a lateral surface of the electrical contact includes two inflection points.

4. The electronic package structure of claim 3, wherein an intersection between the lateral surface of the electrical contact and a top surface of the support layer is located between the two inflection points.

5. An electronic package structure comprising:
   an electronic structure including an encapsulant encapsulating a semiconductor element;
   a wiring structure located over the electronic structure;
   an interlayer disposed on the encapsulant; and
   a gap located between the wiring structure and the electronic structure, and including a space accommodating the interlayer and a channel dividing the interlayer into a first portion and a second portion, wherein an area of the first portion of the interlayer is different from an area of the second portion of the interlayer in a top view, wherein, in the top view, the interlayer further includes a third portion separated from the first portion and the second portion, and wherein the first portion, the second portion and the third portion are disposed around the semiconductor element.

6. The electronic package structure of claim 5, wherein, in the top view, a width of a slit between the semiconductor element and the first portion of the interlayer is non-uniform.

7. The electronic package structure of claim 5, wherein the space is in communication with the channel, and a top surface of the semiconductor element is exposed in the channel.

8. An electronic package structure comprising:
   an electronic structure including an encapsulant encapsulating a semiconductor element and an underfill partially encapsulating the semiconductor element;
   a wiring structure located over the electronic structure;
   an interlayer disposed on the encapsulant; and
   a gap located between the wiring structure and the electronic structure, and including a space accommodating the interlayer and a channel dividing the interlayer into a first portion and a second portion, wherein an area of the first portion of the interlayer is different from an area of the second portion of the interlayer in a top view;
   wherein a top surface of the underfill is exposed in the channel.

* * * * *